United States Patent

Hara et al.

[11] Patent Number: 6,054,752
[45] Date of Patent: Apr. 25, 2000

[54] SEMICONDUCTOR DEVICE

[75] Inventors: Kazukuni Hara, Kasugai; Yuichi Takeuchi, Obu; Tsuyoshi Yamamoto, Kariya; Rajesh Kumar, Kariya; Mitsuhiro Kataoka, Kariya, all of Japan

[73] Assignee: Denso Corporation, Kariya, Japan

[21] Appl. No.: 09/107,507

[22] Filed: Jun. 30, 1998

[30] Foreign Application Priority Data

| Jun. 30, 1997 | [JP] | Japan | 9-174873 |
| Mar. 11, 1998 | [JP] | Japan | 10-060190 |
| Mar. 18, 1998 | [JP] | Japan | 10-068895 |
| Apr. 21, 1998 | [JP] | Japan | 10-111029 |

[51] Int. Cl.[7] .............................. H01L 29/34; H01L 29/40
[52] U.S. Cl. .......................... 257/629; 257/630; 257/652
[58] Field of Search .................................. 257/629, 630, 257/652

[56] References Cited

U.S. PATENT DOCUMENTS

| 3,892,609 | 7/1975 | Coppen . |
| 3,911,473 | 10/1975 | Nienhuis . |
| 4,400,716 | 8/1983 | Tani et al. . |
| 4,691,224 | 9/1987 | Takada . |
| 5,475,258 | 12/1995 | Kato et al. . |
| 5,506,421 | 4/1996 | Palmour . |
| 5,614,749 | 3/1997 | Ueno . |
| 5,693,569 | 12/1997 | Ueno . |
| 5,723,376 | 3/1998 | Takeuchi et al. . |

FOREIGN PATENT DOCUMENTS

| 5036052A2 | 9/1992 | European Pat. Off. . |
| 622853A1 | 11/1994 | European Pat. Off. . |
| 671769A2 | 9/1995 | European Pat. Off. . |
| 4-239778 | 8/1992 | Japan . |
| 5-259443 | 10/1993 | Japan . |
| 7-161983 | 6/1995 | Japan . |
| 8-167713 | 6/1996 | Japan . |
| 9-074193 | 3/1997 | Japan . |

OTHER PUBLICATIONS

Shenoy, et al., "The Planar 6H–SiC ACCUFET: A New High–Voltage Power MOSFET Structure", IEEE Electron Device Letters, Dec. 12, 1997, vol. 18, No. 12, p. 589–591.
Rottner, et al., "OBIC measurements on 6H SiC p+—n— mesa diodes with floating field rings", Inst. Phys. Conf., 1995, Ser. No. 142, Chapter 4, p. 721–724.

Primary Examiner—Stephen D. Meier
Attorney, Agent, or Firm—Pillsbury Madison & Sutro LLP

[57] ABSTRACT

A semiconductor device comprises a semiconductor substrate including a first conductivity type first semiconductor layer and a second conductivity type second semiconductor layer formed on the first semiconductor layer. A unit cell for controlling current flowing between a source electrode and a drain electrode is formed in the semiconductor substrate. A trench is formed in a peripheral region of the unit cell to form mesa structure. A field relaxing layer is formed between an insulating film on a side face of the second trench and both the first semiconductor layer and the second semiconductor layer in order to relax concentration of an electric field in the insulating film.

32 Claims, 27 Drawing Sheets

PERIPHERAL REGION | CELL REGION

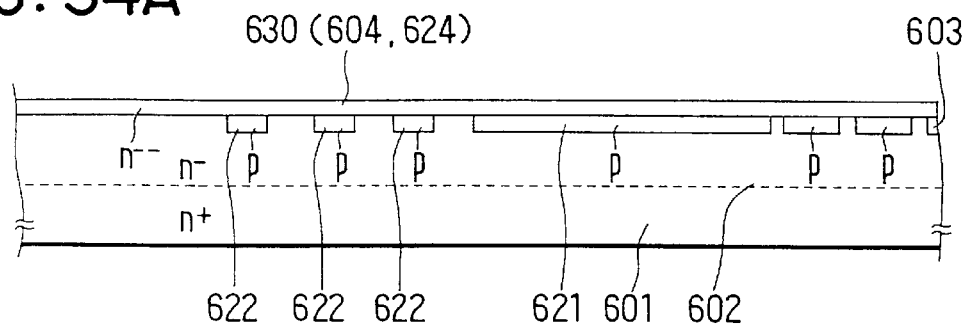
FIG. 34A
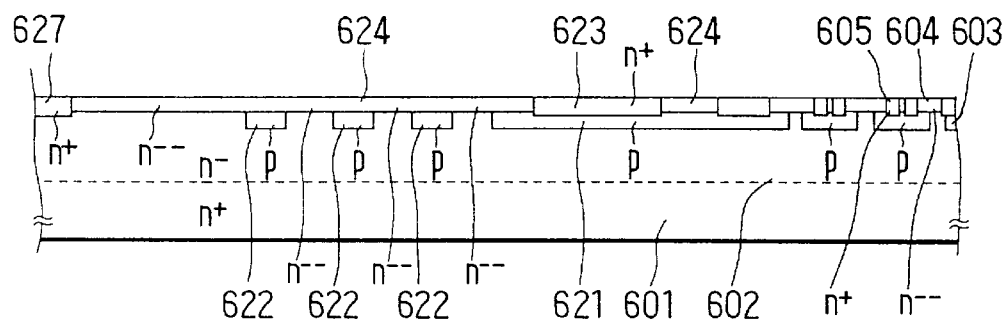
FIG. 34B
FIG. 36   RELATED ART
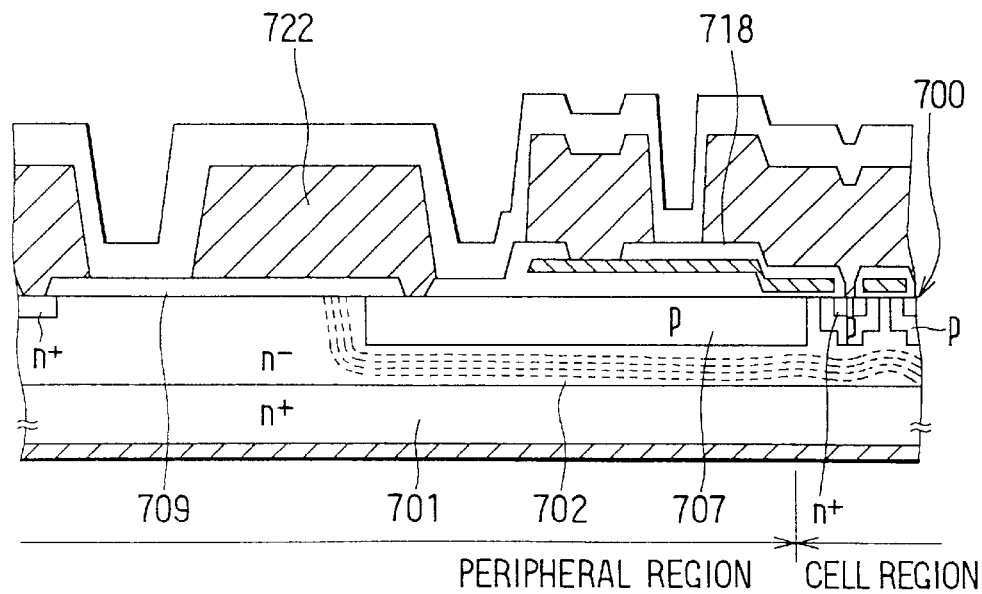

6,054,752

SEMICONDUCTOR DEVICE

CROSS REFERENCE TO RELATED APPLICATION

This application is based upon and claims the benefit of priority of Japanese Patent Applications No. Hei.9-174873 filed Jun. 30, 1997, No. Hei.10-60190 filed Mar. 11, 1998, No. Hei.10-68895 filed Mar. 18, 1998, and No. Hei.10-111029 filed Apr. 21, 1998, the contents of which are incorporated herein by reference.

BACKGROUND OF THE INVENTION

1. Field of the Invention

The present invention relates to a semiconductor device. In particular, the present invention is preferably applied to an insulated gate field effect transistor (hereinafter referred to as a power MOSFET) or specifically to a vertical type power MOSFET.

2. Description of Related Art

There have been known a field plate structure and a guard ring structure as structures applied to a peripheral region of a chip (peripheral region of a unit cell) of a semiconductor device. FIG. 36 shows an accumulated channel type planar MOSFET to which the field plate structure is applied as one example of those structures.

As shown in FIG. 36, a p-type layer region 707 which extends to the side distant from a cell region on the surface layer portion of an $n^-$-type semiconductor layer 702 which is formed on an $n^+$-type semiconductor substrate 701 is disposed in the peripheral region of the cell region where a planar MOSFET 700 is formed. This p-type layer region 707 plays a role of preventing a breakdown by forming a PN junction with the $n^-$-type semiconductor layer 702.

In the peripheral region, there is also provided an electrode 722 which contacts with the p-type layer region 707 via a contact hole formed in an insulating film 718 and which extends to the side distant from the cell region. This electrode 722 is a field plate and its potential is equalized with that of the p-type layer region 707. As a result, because a depletion layer is caused to extend to the periphery of the cell region, a withstand voltage of the device is enhanced.

Further, because a withstand voltage of a semiconductor device is determined by the shape and the like of a region where a PN junction terminates in general, there has been termination technology for weakening an electric field in that region without bias thereof in order to obtain a semiconductor device having a high withstand voltage. As one of such termination technology, there has been proposed a mesa structure as disclosed in Japanese Patent Application Laid-Open No. Hei. 4-239778.

An n-channel type vertical power MOSFET is shown in FIG. 37 as a semiconductor device having the mesa structure. The mesa structure will be explained with reference to FIG. 37.

A semiconductor substrate 820 of the vertical power MOSFET is formed by laminating an $n^-$-type silicon carbide semiconductor layer 802 and a p-type silicon carbide conductive layer 803 on an $n^+$ silicon carbide semiconductor substrate 801. A trench 807 is then formed in this substrate, and an oxide film 809 and a gate electrode 810 are formed within the trench 807. A source region 804 is formed further around the trench 807, thus completing a cell region. Then, another trench 805 is formed so as to surround the periphery of the cell region. The trench 805 is formed so that the side face thereof is tapered for example. The mesa structure is what the PN junction composed of the $n^-$-type silicon carbide semiconductor layer 802 and the p-type silicon carbide conductive layer 803 at the periphery of the cell region is terminated at the side face of the trench 805.

The adoption of such mesa structure allows the withstand voltage of the semiconductor device to be increased. It is noted that, as shown in FIG. 38, there is a case when the mesa structure is arranged such that the side face of a trench 905 is almost vertical relative to the surface of the substrate, not tapered as described above.

However, it has been found that the above-mentioned structures have had the following problems.

Firstly, as for the field plate structure shown in FIG. 36, when silicon carbide is used as a semiconductor material, the critical field strength at which an avalanche breakdown occurs is large by one digit and the concentration of impurity of a drain layer ($n^+$-type semiconductor layer 701) can be set high by one digit, as compared to the case of using silicon. Accordingly, it has had advantages that the resistance value of the drain layer can be lowered and the ON resistance can be lowered. However, when the impurity concentration is set high as described above, the extension of the depletion layer toward the side distant from the cell region is suppressed as shown by equipotential lines in FIG. 36 and the concentration of an electric field occurs at the interface of the insulating film 709. Therefore, there has been a problem that, when an avalanche breakdown once occurs at this interface, hot carriers having high energy may be implanted to the insulating film 709, causing a dielectric breakdown of the insulating film 709. This problem occurs in the same manner also when the guard ring structure is adopted.

Meanwhile, there has been a problem in the mesa structure shown in FIG. 37 that the concentration of the electric field occurs at the side part of the trench 805, or more concretely at the connecting part between the interface of the $n^-$-type silicon carbide semiconductor layer 802 and the p-type silicon carbide conductive layer 803 and the oxide film 809, causing a dielectric breakdown of the oxide film 809 at the part where the electric field is concentrated.

Further, in a case of the mesa structure, there has been another problem that, when the side face of the trench 905 is vertical relative to the surface of the substrate as shown in FIG. 38, the concentration of an electric field is liable to occur also at the corner part of the trench 905 and a dielectric breakdown of an insulating film 909 occurs at this part.

SUMMARY OF THE INVENTION

Accordingly, in view of the above-mentioned problems, it is an object of the present invention to prevent a dielectric breakdown of an insulating film caused by the concentration of an electric field in a (silicon carbide) semiconductor device.

In order to achieve the above-mentioned object, the following technological means are adopted.

A semiconductor device of the present invention comprises a semiconductor substrate which is composed of a first conductivity type low resistance layer, a first conductivity type first semiconductor layer which is formed on the low resistance layer and whose resistance is higher than the low resistance layer, and a second conductivity type second semiconductor layer formed on the first semiconductor layer. A surface of the second semiconductor layer is a main surface of the semiconductor substrate. A first trench for forming a cell region and a second trench for forming a mesa structure are formed in the main surface of the semiconductor substrate. Further, a field relaxing layer for relaxing concentration of an electric field in an insulating film is formed between the insulating film on the side face of the second trench and both the first semiconductor layer and the second semiconductor layer.

By constructing the semiconductor device as described above, it is possible to relax the concentration of an electric field at the part between the interface of the first and second semiconductor layers and the insulating film, and to prevent a dielectric breakdown of the insulating film.

The field relaxing layer may be formed from the side face of the second trench to the bottom thereof. Then, it is possible to relax the concentration of an electric field at the corner part of the trench, and to prevent the dielectric breakdown of the insulating film of this part.

Preferably, the field relaxing layer is formed by a material of the first conductivity type and its resistance is higher than that of the first semiconductor layer. As a result, an extension of a depletion layer is increased by the field relaxing layer, thus relaxing the concentration of an electric field at the part between the interface of the first and second semiconductor layers and the insulating film.

It is also preferable to provide an electrode layer for controlling a potential of the field relaxing layer on the surface of the insulating film formed on the surface of the field relaxing layer and to control the voltage of the field relaxing layer to be lower than a threshold voltage.

Because the field relaxing layer can be always depleted by controlling the voltage of the field relaxing layer to be lower than the threshold voltage, it is possible to prevent the concentration of an electric field from occurring at the part between the interface of the first and second semiconductor layers and the insulating film.

The field relaxing layer can be formed by a material of the second conductivity type. In this case, the electric field in the first semiconductor layer escapes toward the bottom of the second trench. As a result, it is possible to prevent the concentration of an electric field from occurring at the part between the interface of the first and second semiconductor layers and the insulating film.

Further, when the field relaxing layer is formed from the side face of the second trench to the bottom thereof, it is possible to prevent the dielectric breakdown of the insulating film more effectively by causing an avalanche breakdown within the first semiconductor layer due to the depletion layer generated by the PN junction formed by the field relaxing layer and the first semiconductor layer.

It is also possible to form a third trench which penetrates through the second semiconductor layer from the main surface of the semiconductor substrate between the first and second trenches. The third trench electrically divides the second semiconductor layer. As a result, the third trench can prevent an avalanche breakdown current from flowing in the cell region, so that it is possible to prevent the cell region from being damaged by that current. Therefore, the durability of the semiconductor device can be enhanced.

It is noted that, in the semiconductor device constructed as described above, it is preferable to form the low resistance layer, the first semiconductor layer, the second semiconductor layer and the field relaxing layer by silicon carbide. It is also possible to form the low resistance layer, the first semiconductor layer and the second semiconductor layer by silicon carbide and to form the field relaxing layer by an aluminum alloy. Because it allows the aluminum alloy to be formed by a method other than epitaxial growth, the step for forming the field relaxing layer can be simplified.

It is also possible to form a first conductivity type first semiconductor region in the second semiconductor layer so that an end of the first semiconductor region terminates on the main surface, to form a second conductivity type second semiconductor region in the first semiconductor layer at the bottom of the second trench and to electrically contact the first semiconductor region with the second semiconductor region by a first electrode.

The thickness of the first semiconductor layer at the bottom of the second trench is thinner than that of the part of the first semiconductor layer where the second trench is not formed. Therefore, by forming the second semiconductor region on the first semiconductor layer at the bottom of the second trench, the PN junction formed by the first semiconductor layer and the second semiconductor region has a withstand voltage lower than that of the PN junction formed by the first semiconductor layer and the second semiconductor layer.

Accordingly, by electrically contacting the first semiconductor region and the second semiconductor region by the first electrode, an avalanche breakdown can be caused at the PN junction formed by the first semiconductor layer and the second semiconductor region before a dielectric breakdown occurs in the insulating film by the concentration of an electric field which might otherwise occur at the part between the interface of the first and second semiconductor layers and the insulating film. Thereby, it is possible to prevent the dielectric breakdown of the insulating film.

It is noted that it is possible to prevent the dielectric breakdown of the insulating film not only in the semiconductor device of the trench gate type, but also in the other types of the (silicon carbide) semiconductor device having the mesa structure by forming the field relaxing layer on the side face of the trench forming the mesa structure.

It is also possible to form a second conductivity type second semiconductor region on the surface layer portion of the first semiconductor layer at the corner of a second trench forming the mesa structure.

In such a case, even when a high voltage is applied between the PN junction composed of the first semiconductor layer and the second semiconductor layer, the depletion layer can be caused to extend around the second semiconductor region. Therefore, the second semiconductor region allows the concentration of an electric field at the corner part of the second trench forming the mesa structure to be relaxed and to prevent the dielectric breakdown of the insulating film.

It is preferable to form the second trench forming the mesa structure so as to surround the periphery of the first trench for forming the cell region.

The field relaxing layer formed on the side face of the second trench forming the mesa structure may be made of a semiconductor material of the first conductivity type. Further, the second semiconductor region may be formed at the location including the part where the side face of the second trench contacts with the bottom thereof. Because the location where the concentration of the electric field is liable to occur most is the part where the side face of the second trench contacts with the bottom thereof among the corner part of the trench, the concentration of the electric field may be relaxed most effectively by forming the second semiconductor region so as to include this part.

A semiconductor device according to another mode of the present invention comprises a first conductivity low resistance layer, a first conductivity type first semiconductor layer whose resistance is higher than that of the low resistance layer and which is formed on the low resistance layer, a unit cell formed in a predetermined region of the first semiconductor layer, a second conductivity type device separating layer formed in the periphery of a cell region in which the cell unit is formed and extended, on the surface layer portion of the first semiconductor layer, to the side distant from the cell region to separate the device, a field plate disposed on an insulating film formed on the device separating layer and formed to project to the side distant from the cell region rather than the device separating layer, a first electrode which electrically contacts with both the unit cell and the device separating layer, and a second electrode which electrically contacts on the back surface of the low resistance layer. Further, a first conductivity type semiconductor thin film layer whose resistance is higher than that of the first semiconductor layer is formed between an insulating film disposed below the field plate and the first semiconductor layer.

By forming the semiconductor thin film layer, whose resistance is higher than that of the first semiconductor layer, below the field plate as described above, when a reverse bias voltage is applied between the first and second electrodes, the extension of the depletion layer from the device separating layer toward the side distant from the cell region can be increased. Therefore, a field strength at the interface between the insulating film below the field plate and the first semiconductor layer can be relaxed, thus preventing the dielectric breakdown of the insulating film.

It is noted that the semiconductor thin film layer can be formed by growing an epitaxial film on the first semiconductor layer. In this case, the semiconductor thin film layer having impurity concentration which is lower than that of the first semiconductor layer can be formed with high precision. For instance, although it is possible to form the semiconductor thin film layer by implanting ions to the first semiconductor layer, it is difficult to control the impurity concentration of the semiconductor thin film layer to be lower than that of the first semiconductor layer.

It is also possible to provide a plurality of second conductivity type second semiconductor layers having a predetermined width at predetermined intervals from the device separating layer. Further, in this case, it is preferable to form a first conductivity type semiconductor thin film layer whose resistance is higher than that of the first semiconductor layer on the first semiconductor layer between the plurality of second semiconductor layers and between one of the second semiconductor layers and the device separating layer.

By forming the high resistance semiconductor thin film layer between the plurality of second semiconductor layers constructing the guard ring structure, the extension of the depletion layer may be increased and the insulating film formed on the second semiconductor layers can be protected from dielectric breakdown.

It is noted that, in this case, it is preferable to form the high resistance semiconductor thin film layer between the insulating film below the field plate and the first semiconductor layer.

That is, one of characteristics of the semiconductor device according to the present invention is in that a first conductivity type field relaxing layer whose resistance is higher than that of the first semiconductor layer is formed in contact with the surface of the first semiconductor layer in the peripheral area of the cell region.

By constructing the semiconductor device as described above, the extension of the depletion layer generated by a PN junction formed between a second conductivity type semiconductor region formed in the cell region and the first semiconductor layer can be increased by the field relaxing region in the peripheral area. As a result, a withstand voltage in the peripheral region of the cell region of the semiconductor device can be enhanced.

When silicon carbide (SiC) is used as a semiconductor material, because the concentration of the first semiconductor layer can be made high due to the characteristic of the material, the extension of the depletion layer does not increase and the withstand voltage of the peripheral region of the cell region of the semiconductor device may not be assured. However, according to the semiconductor device of the present invention, the withstand voltage of the peripheral region can be assured by the above-mentioned field relaxing region.

BRIEF DESCRIPTION OF DRAWINGS

These and other objects, features and characteristics of the present invention will be appreciated from a study of the following detailed description, the appended claims, and drawings, all of which form a part of this application. In the drawings:

FIGS. 33A to 33C, 34A, 34B, 35A to 35C are sectional views showing steps for manufacturing the silicon carbide semiconductor device shown in FIG. 32;

FIG. 36 is a sectional view showing a distribution of an electric field in a conventional planer type power MOSFET in which a field plate structure is adopted;

DESCRIPTION OF PREFERRED EMBODIMENTS

Figure 1:
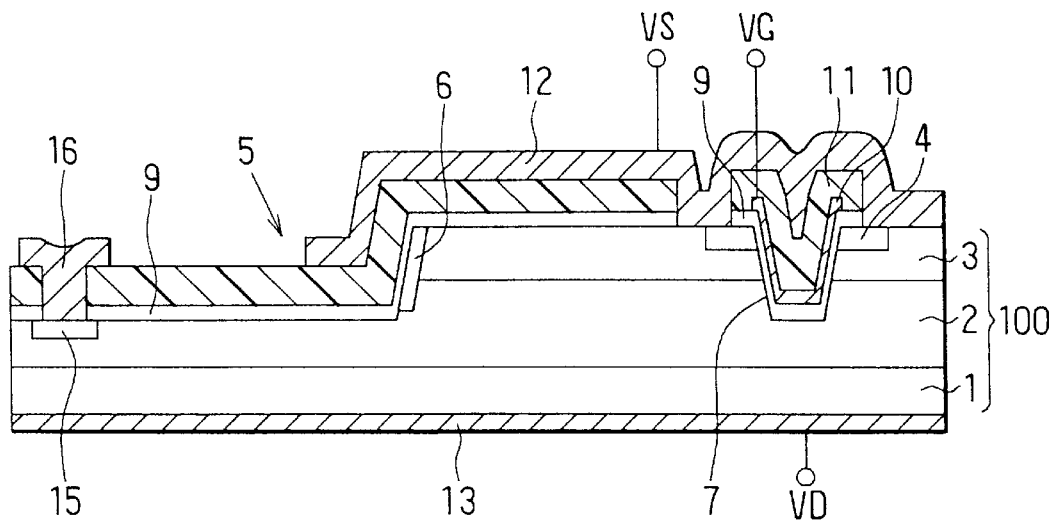
FIG. 1 is a sectional view of a vertical power MOSFET according to a first embodiment of the present invention.

The present invention will be explained below in detail based on the preferred embodiments thereof shown in the drawings.
(First Embodiment)

FIG. 1 is a section view of a vertical type n-channel power MOSFET according to a first embodiment of the invention. A structure of the vertical type power MOSFET will be explained below based on FIG. 1.

An $n^-$-type silicon carbide semiconductor layer 2 as a high resistance semiconductor layer and a p-type silicon carbide semiconductor layer 3 are laminated sequentially on an $n^+$-type silicon carbide semiconductor substrate 1 as a low resistance semiconductor layer made of hexagonal silicon carbide. A semiconductor substrate 100 made of mono-crystal silicon carbide is thus composed of the $n^+$-type silicon carbide semiconductor substrate 1, the $n^-$-type silicon carbide semiconductor layer 2 and the p-type silicon carbide semiconductor layer 3. An upper face of the semiconductor substrate 100 is formed to be substantially a (000 $\bar{1}$) carbon face.

An $n^+$-type source region 4 as a semiconductor region is formed within a predetermined region on a surface layer portion within the p-type silicon carbide semiconductor layer 3. Further, a trench 7 is formed at a predetermined region of the $n^+$-type source region 4. The trench 7 penetrates through the $n^+$-type source region 4 and the p-type silicon carbide semiconductor layer 3 and reaches the $n^-$-type silicon carbide semiconductor layer 2.

A trench 5 is formed at a predetermined region of the p-type silicon carbide semiconductor layer 3 so as to have the same depth with or to be deeper than the trench 7. The trench 5 is formed so as to surround the cell region centering on the trench 7 for forming a cell unit. A mesa structure is constructed by the trench 5.

A high resistance layer 6 made of $n^-$-type silicon carbide semiconductor serving as a field relaxing layer is formed on the side face of the trench 5. The high resistance layer 6 is formed such that its resistance is higher than that of the $n^-$-type silicon carbide semiconductor layer 2 and the impurity concentration thereof is lower than that of the $n^-$-type silicon carbide semiconductor layer 2 by about one digit.

Further, a thermal oxide film 9 is formed as a gate insulating film on the substrate including the trenches 5 and 7. Further, a gate electrode 10 made of poly-silicon is formed within the trench 7 corresponding to a part where a channel is to be created in the p-type silicon carbide semiconductor layer 3. An insulating film 11 is formed on the semiconductor substrate 100 including the gate electrode 10.

A source electrode 12 is formed on the insulating film 11 and electrically conducts with the $n^+$-type source region 4 and the p-type silicon carbide semiconductor layer 3 via a contact hole formed in the thermal oxide film 9 and the insulating film 11.

It is noted that a high concentration $n^+$-type silicon carbide semiconductor layer 15 is formed so as to surround the cell region on the surface layer portion of the $n^-$-type silicon carbide semiconductor layer 2 which forms the bottom of the trench 5. The $n^+$-type silicon carbide semiconductor layer 15 electrically conducts with an electric wire 16 via a contact hole formed in the thermal oxide film 9 and the insulating film 11. Because the potential of the part around the cell is kept equal by the electric wire 16 when the vertical power MOSFET is in operation, the degree of extension of the depletion layer from a PN junction between the p-type silicon carbide semiconductor layer 3 and the $n^-$-type silicon carbide semiconductor layer 2 is uniformed.

As described above, the vertical power MOSFET is constructed so as to have the $n^-$-type high resistance layer 6 at the side face of the trench 5 at the outermost periphery of the cell region. The $n^-$-type high resistance layer 6 plays a role of preventing a dielectric breakdown of the thermal oxide film 9 in the vicinity of the interface of the $n^-$-type silicon carbide semiconductor layer 2 and the p-type silicon carbide semiconductor layer 3, i.e. at a part forming the mesa structure.

When a predetermined driving voltage is applied to the gate electrode 10 of the vertical power MOSFET thus constructed, the p-type silicon carbide semiconductor layer 3 between the $n^-$-type silicon carbide semiconductor layer 2 and the $n^+$-type source region 4 turns to a channel region, thus flowing an electric current. It is noted that, in the figure, potentials at the gate, source and drain of the vertical power MOSFET are denoted as VG, VS and VD, respectively.

Figure 2:
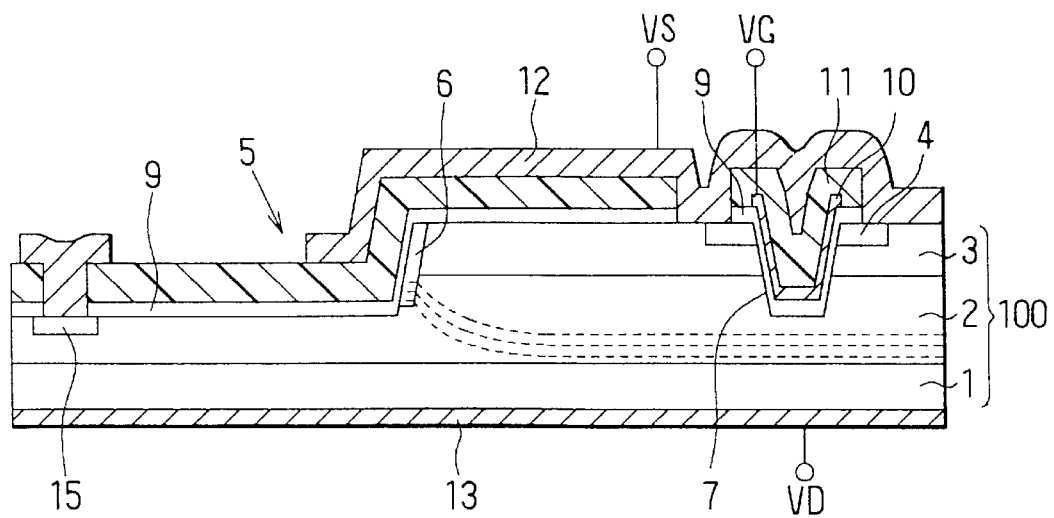
FIG. 2 is a sectional view showing a distribution of an electric field in the vertical power MOSFET shown in FIG. 1.

FIG. 2 is a sectional view showing curves of a distribution of an electric field (equipotential lines) within the $n^-$-type silicon carbide semiconductor layer 2 when the vertical power MOSFET shown in FIG. 1 is in operation.

As shown in the figure, the electric field in the $n^-$-type silicon carbide semiconductor layer 2 has a distribution spread in plane by the mesa structure. Further, it can be found that the electric field is concentrated in the vicinity of the high resistance layer 6, and the curves of the distribution of the electric field terminate at the high resistance layer 6.

Because the electric field is concentrated at the high resistance layer 6, the concentration of the electric field is seen also in the thermal oxide film 9. In this case, if a breakdown occurs at the high resistance layer 6, it is an avalanche breakdown in the vicinity of the region where the high resistance layer 6, the p-type silicon carbide semiconductor layer 3 and the n⁻-type silicon carbide semiconductor layer 2 intersect to one another. That is, because it is not a breakdown between the thermal oxide film 9 and the interface of the n⁻-type silicon carbide semiconductor layer 2 and the p-type silicon carbide semiconductor layer 3, it is possible to prevent a dielectric breakdown of the thermal oxide film 9. In this way, because it is possible to prevent the dielectric breakdown of the thermal oxide film 9, the withstand voltage of the vertical power MOSFET can be enhanced.

Next, steps for manufacturing the trench gate type power MOSFET will be explained based on FIGS. 3A through 3C, FIGS. 4A through 4C and FIGS. 5A through 5C.

Figure 3A:
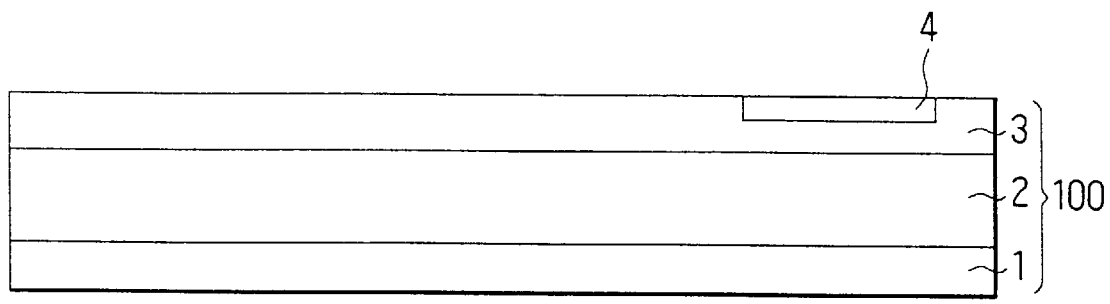
FIGS. 3A to 3C, 4A to 4C and 5A to 5C are section views showing steps for manufacturing the vertical power MOSFET shown in FIG. 1.

[Step Shown in FIG. 3A]

At first, the low resistance n⁺-type silicon carbide semiconductor substrate 1 whose main surface is the (000$\bar{1}$) carbon face is prepared. The n⁻-type silicon carbide semiconductor layer 2 is epitaxially grown on the surface of the n⁺-type silicon carbide semiconductor substrate 1. Further, the p-type silicon carbide semiconductor layer 3 is epitaxially grown on the n⁻-type silicon carbide semiconductor layer 2. Thereby, the semiconductor substrate 100 composed of the n⁺-type silicon carbide semiconductor substrate 1, the n⁻-type silicon carbide semiconductor layer 2 and the p-type silicon carbide semiconductor layer 3 is formed.

Then, the n⁺-type source region 4 is formed in the predetermined region of the surface layer portion of the p-type silicon carbide semiconductor layer 3 by implanting ions such as nitrogen using a mask placed on the p-type silicon carbide semiconductor layer 3.

Figure 3B:
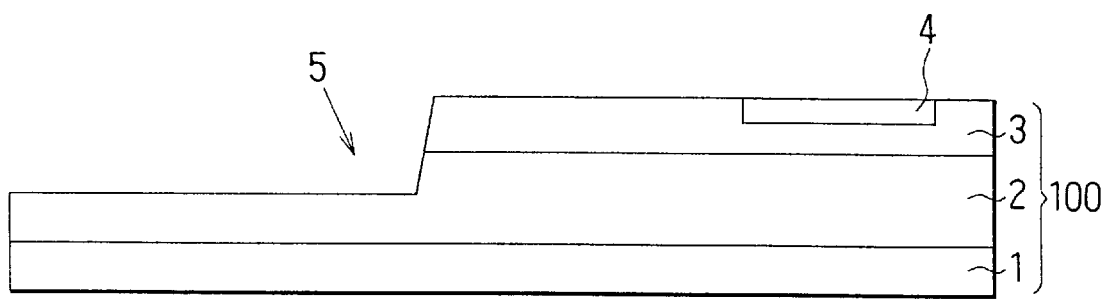

[Step Shown in FIG. 3B]

Then, the trench 5 which penetrates through the p-type silicon carbide semiconductor layer 3 and reaches the n⁻-type silicon carbide semiconductor layer 2 is formed by means of dry etching. At this time, the trench 5 is formed to be almost circular centering on the n⁺-type source region 4 which turns to the cell region.

Figure 3C:
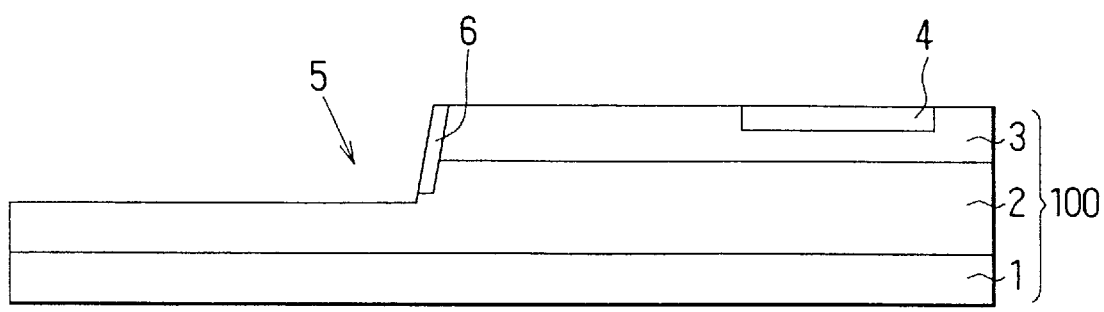

[Step Shown in FIG. 3C]

The high resistance layer 6 which is made of n⁻-type silicon carbide semiconductor is formed on the side face of the trench 5 by forming an epitaxial growth layer and by thermally oxidizing the epitaxial growth layer. It is noted that the high resistance layer 6 is formed to have impurity concentration which is lower than that of the n⁻-type silicon carbide semiconductor layer 2, i.e. to have a resistance which is higher than that of the n⁻-type silicon carbide semiconductor layer 2. In the epitaxial growth and thermal oxidization steps, because the n⁻-type silicon carbide semiconductor layer 2 and the p-type silicon carbide semiconductor layer 3 have a hexagonal crystal structure, the n⁻-type silicon carbide semiconductor layer 6 is formed homogeneously by anisotropy of the epitaxial growth or anisotropy of the oxidation with high controlability (see Japanese Patent Application Laid-Open Nos. Hei. 7-326755 and Hei. 9-74193 and Japanese Patent Application No. Hei. 8-9625).

Figure 4A:
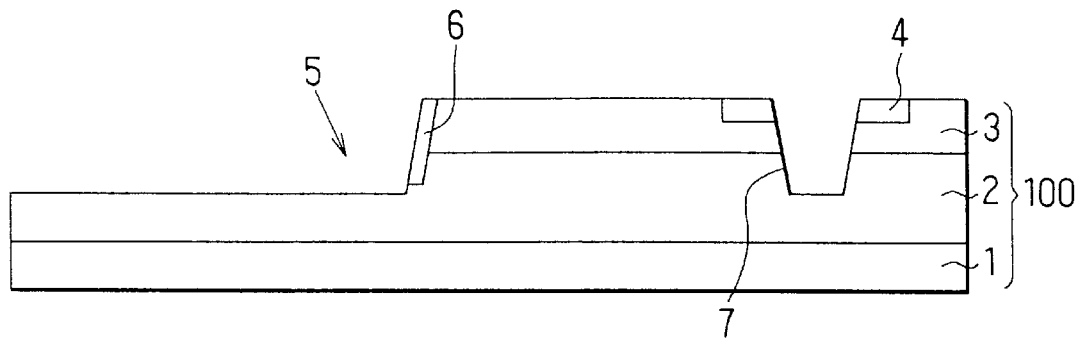

[Step Shown in FIG. 4A]

Then, the trench 7 which penetrates through the n⁺-type source region 4 and the p-type silicon carbide semiconductor layer 3 is formed at the center part of the n⁺-type source region 4. At this time, the trench 7 is formed so as to have the same depth as or to be shallower than the trench 5.

Because the step of forming the trench 7 is performed after the step of forming the n⁻-type silicon carbide semiconductor layer 6, no silicon carbide semiconductor layer is formed within the trench 7. Therefore, a semiconductor layer whose conductivity type is different from that of the n⁻-type silicon carbide semiconductor layer 6, a semiconductor layer having the same conductivity type but a different concentration, or a semiconductor layer having a different thickness can be separately formed within the trench 7. Thereby, parameters of the vertical power MOSFET can be varied.

Figure 4B:
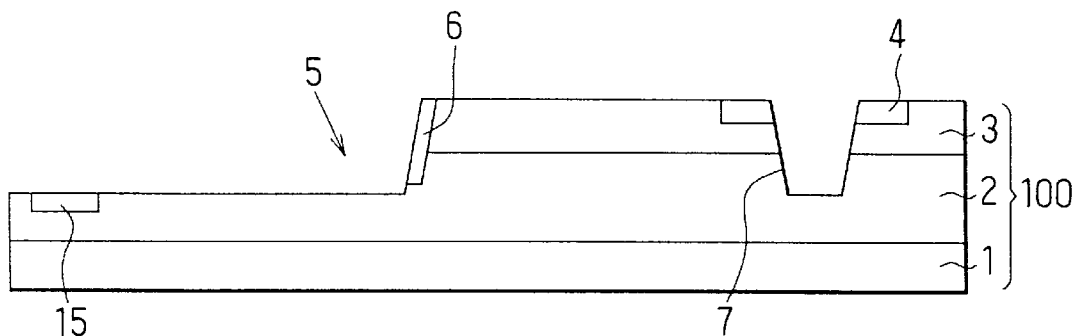

[Step Shown in FIG. 4B]

Next, the p⁺-type silicon carbide semiconductor layer 15 which surrounds the cell region is formed at the bottom of the trench 5 by implanting ions of, for example, nitrogen to the n⁻-type silicon carbide semiconductor layer 2 using a mask placed thereon.

Figure 4C:
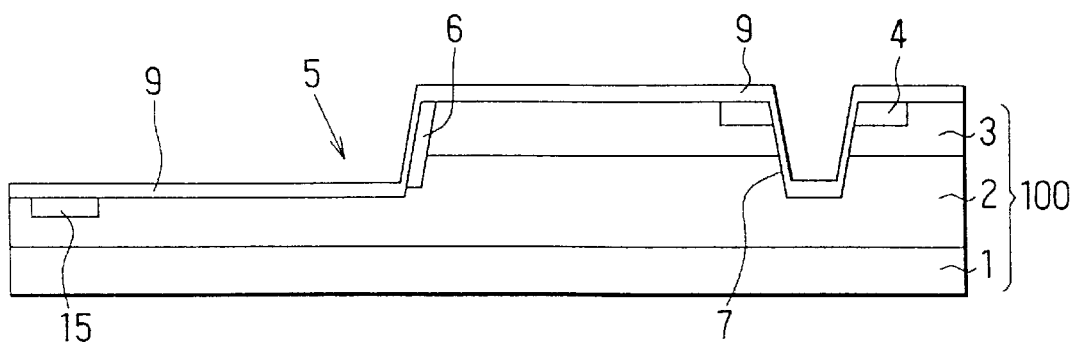

[Step Shown in FIG. 4C]

Then, the thermal oxide film 9 is formed on the surface of the semiconductor substrate 100 including the trenches 5, 7 by means of thermal oxidation. At this time, the thermal oxidation is implemented in wet atmosphere. In detail, the semiconductor substrate 100 is heated up to 1000° C. and thereby the thermal oxide film 9 is formed so as to have a thickness of for example 100 nm on the side face of the trenches 5, 7 and to have a thickness of for example 500 nm on the bottom of the trenches 5, 7.

Figure 5A:
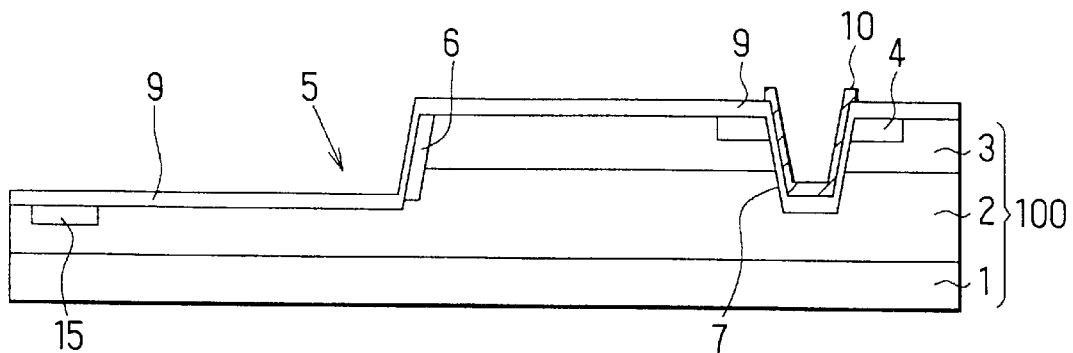

[Step Shown in FIG. 5A]

The poly-silicon layer is deposited on the semiconductor substrate 100. Then the gate electrode 10 is formed on the surface of the thermal oxide film 9 within the trench 7 by means of photo-etching.

Figure 5B:
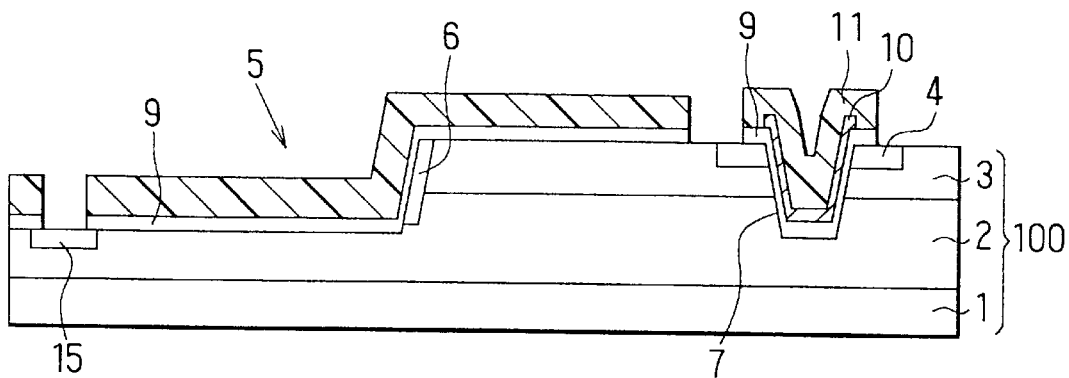

[Step Shown in FIG. 5B]

Then, the insulating film 11 is formed on the upper face of the gate electrode 10 by means of a vapor phase growth method (e.g. chemical vapor deposition). Then, the contact hole is formed selectively in the predetermined region by means of photo-etching.

Figure 5C:
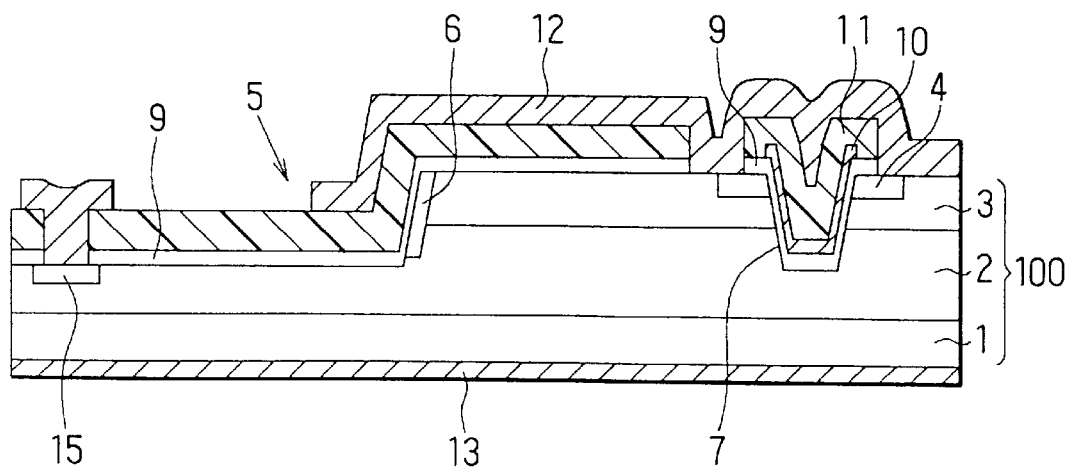

[Step Shown in FIG. 5C]

The source electrode 12 made of for example Ni is formed on the surfaces of the n⁺-type source region 4 and the p-type silicon carbide semiconductor layer 3 including the insulating film 11. Then, the drain electrode 13 made of for example Ni is formed on the back surface of the n⁺-type silicon carbide semiconductor substrate 1. Thereby, the vertical power MOSFET having the structure shown in FIG. 1 is completed.

(Second Embodiment)

A second embodiment of the present invention will be explained below with reference to FIG. 6.

Figure 6:
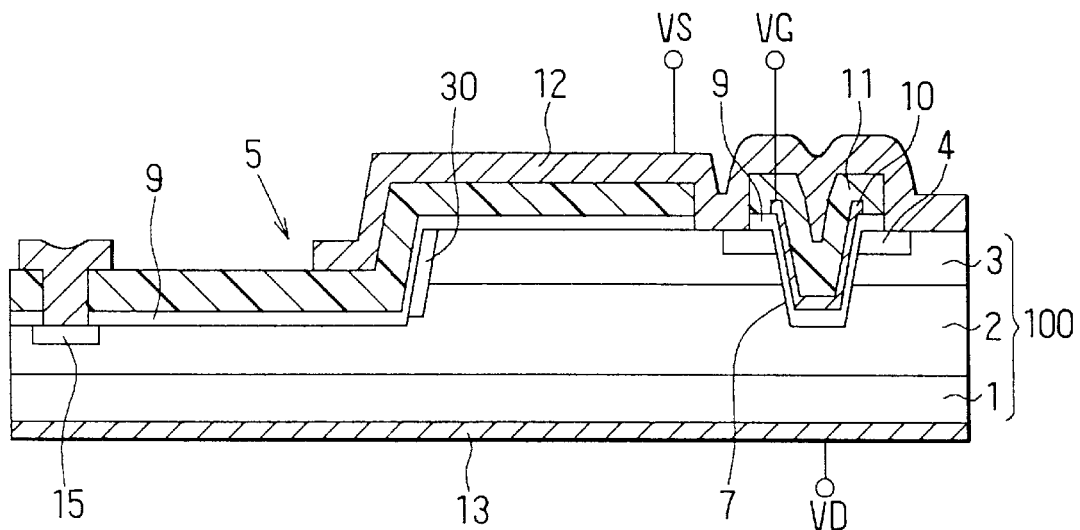
FIG. 6 is a sectional view of a vertical power MOSFET according to a second embodiment of the invention.

While the n⁻-type silicon carbide semiconductor layer 6 was formed on the side face of the trench 5 as a field relaxing layer in the first embodiment described above, a p-type silicon carbide semiconductor layer 30 is formed on the side face of the trench 5 as a field relaxing layer as shown in FIG. 6 in the second embodiment.

Figure 7:
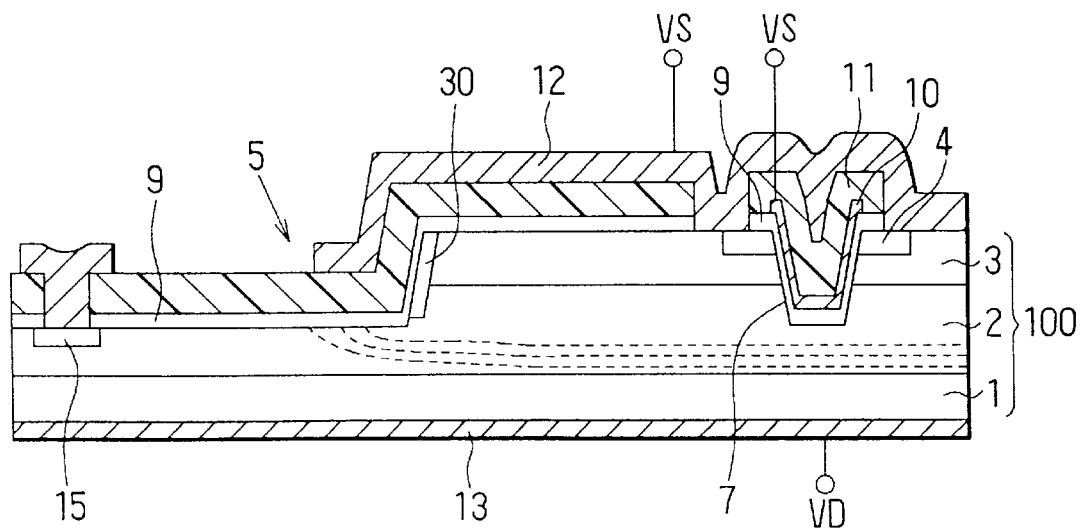
FIG. 7 is a sectional view showing a distribution of an electric field in the vertical power MOSFET shown in FIG. 6.

FIG. 7 shows a distribution of an electric field when the vertical power MOSFET shown in FIG. 6 is in operation. As shown in the figure, the distribution of the electric field varies in response to a depletion layer which is generated by a PN junction between the p-type silicon carbide semiconductor layer 30 and the n⁻-type silicon carbide semiconductor layer 2. That is, curves of the distribution of the electric field extend to the bottom of the trench 5.

As a result, it becomes possible to prevent the electric field from concentrating on the side face of the trench 5 by forming the p-type silicon carbide semiconductor layer 30 on the side face of the trench 5 forming the mesa structure as described above.

It is noted that the p-type silicon carbide semiconductor layer 30 may be formed by implanting ions of, for example, aluminum, instead of growing the silicon carbide semiconductor layer epitaxially, in the step of forming the n⁻-type silicon carbide semiconductor layer 6 in the first embodiment. Further, a metallic layer which exerts the same effect as the p-type silicon carbide semiconductor layer 30 may be formed by depositing an aluminum alloy. In these cases, the field relaxing layer can be formed on the side face of the trench 5 without using the epitaxial growth.

(Third Embodiment)

Figure 8:
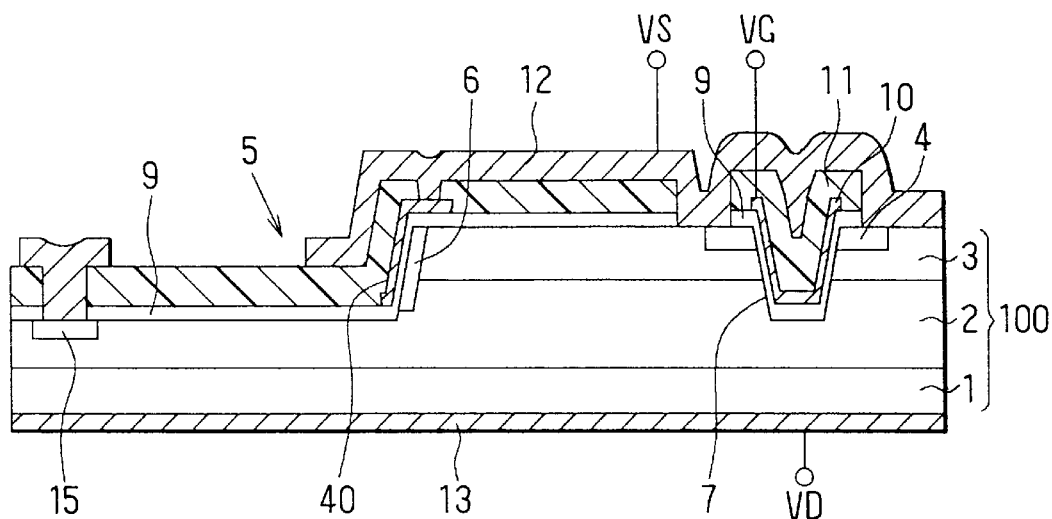
FIG. 8 is a sectional view of a vertical power MOSFET according to a third embodiment of the invention.

A third embodiment of the present invention will be explained below with reference to FIG. 8.

While only the n⁻-type silicon carbide semiconductor layer 6 was formed as the field relaxing layer on the side face of the trench 5 in the first embodiment described above, an electrode layer 40 is provided on the thermal oxide film 9 on the side opposite from the n⁻-type silicon carbide semiconductor layer 6 at the side face of the trench 5 in order to always deplete the n⁻-type silicon carbide semiconductor layer 6 when the vertical power MOSFET is in operation in the third embodiment.

The electrode layer 40 electrically conducts with the source electrode 12 via a contact hole formed in the insulating film 11. When the vertical power MOSFET is in operation, electrons within the n⁻-type silicon carbide semiconductor layer 6 are removed by clamping the electrode layer 40 at the equipotential with the source electrode 12. Thereby, the n⁻-type silicon carbide semiconductor layer 6 is always depleted. Because the concentration of the electric field on the side face of the trench 5 can be prevented by depleting the n⁻-type silicon carbide semiconductor layer 6 as described above, it is possible to prevent a dielectric breakdown of the thermal oxide film 9 at the side face of the trench 5.

As a result, it becomes possible to prevent the dielectric breakdown of the thermal oxide film 9 more reliably as compared to the first embodiment.

It is noted that, while the present embodiment has been arranged such that the electrode layer 40 electrically conducts with the source electrode 12 to lower the voltage of the n⁻-type silicon carbide semiconductor layer 6 less than a threshold voltage, the potential of the electrode layer 40 may be set by a means other than the source electrode 12 as long as this condition is met.

The electrode layer 40 can be formed at the same time at the step of forming the gate electrode 10 shown in FIG. 5A. Further, the vertical power MOSFET of the present embodiment can be manufactured by forming the contact hole for communicating the electrode layer 40 with the source electrode 12 at the same time in forming the contact hole in the insulating film 11 at the step shown in FIG. 5C.

(Fourth Embodiment)

A fourth embodiment of the present invention will be explained below with reference to FIG. 9.

Figure 9:
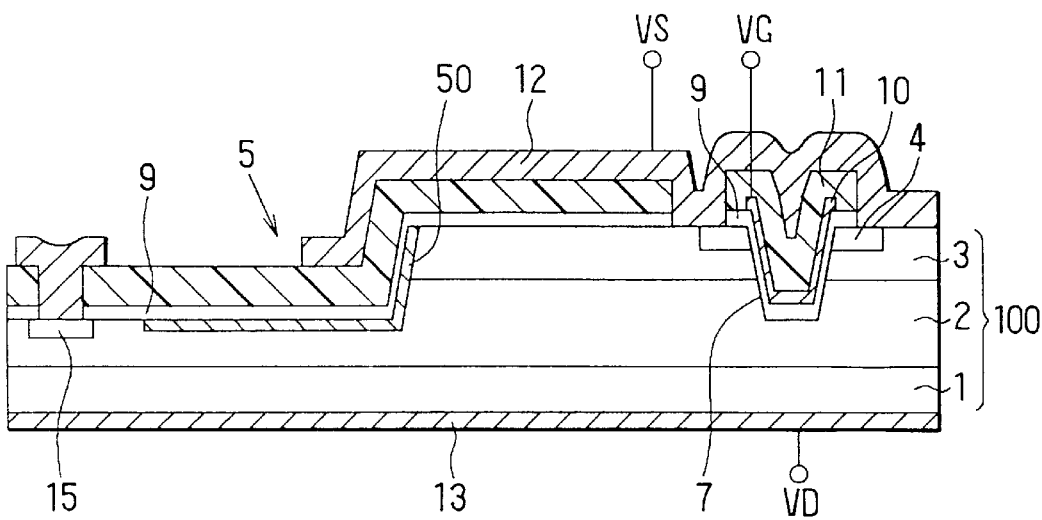
FIG. 9 is a sectional view of a vertical power MOSFET according to a fourth embodiment of the invention.

While the p-type silicon carbide semiconductor layer 30 was formed on the side face of the trench 5 in the second embodiment described above, an electrode layer 50 containing p-type dopant is formed as a field relaxing layer on the side face and almost all over the bottom of the trench 5 as shown in FIG. 9 in the fourth embodiment.

Figure 10:
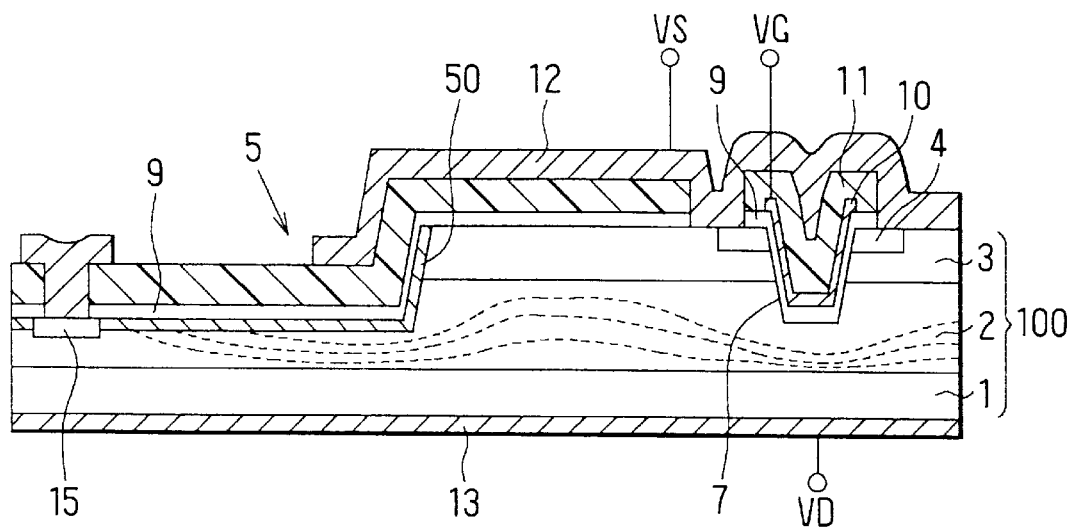
FIG. 10 is a sectional view showing a distribution of an electric field in the vertical power MOSFET shown in FIG. 9.

FIG. 10 shows a distribution of an electric field when the vertical power MOSFET shown in FIG. 9 is in operation. As it is apparent from the figure, the electric field terminates not at the side face of the trench 5 forming the mesa structure but at the bottom of the trench 5. That is, the electrode layer 50 is formed so as to move the concentration of electric field at the side face of the trench 5 to the bottom side of the trench 5 and so as to cause an avalanche breakdown within the n⁻-type silicon carbide semiconductor layer 2 by a depletion layer which is generated at the PN junction between the electrode layer 50 and the n⁻-type silicon carbide semiconductor layer 2.

Because no concentration of the electric field occurs at the side face and the bottom of the trench 5 by forming the electrode layer 50 also on the whole bottom face of the trench 5 in addition to the side face of the trench 5 forming the mesa structure, it is possible to prevent the dielectric breakdown of the thermal oxide film 9 which might otherwise occur due to the concentration of electric field. As a result, the vertical power MOSFET having a large withstand voltage to the avalanche breakdown can be realized.

It is noted that, although the electrode layer 50 has been formed by the electrode layer containing the p-type dopant in the present embodiment, the electrode layer 50 may be formed by a silicon carbide layer. In this case, because the electrode layer 50 composed of the silicon carbide layer is always depleted, the same effects as the case of the electrode layer 50 containing the p-type dopant can be obtained.

The same effects as the case described above may be obtained also when a metal such as Al—Ti is applied as the electrode layer 50. It is noted that when the metal such as Al—Ti is used, the field relaxing layer can be formed by implanting ions of aluminum. Therefore, because the field relaxing layer can be formed by means of ion implantation without using the epitaxial growth used in a case of the silicon carbide layer, the step for forming the field relaxing layer can be simplified.

(Fifth Embodiment)

A fifth embodiment of the present invention will be explained below with reference to FIG. 11.

While the side face of the trench 5 forming the mesa structure was connected with the cell region (channel formation region) via the p-type silicon carbide semiconductor layer 3 in the first embodiment described above, the side face of the trench 5 is electrically separated (insulated) from the cell region by forming a trench 70 between the side face of the trench 5 and the cell region in the present embodiment.

That is, in the PN junction formed between the p-type silicon carbide semiconductor layer 3 and the n⁻-type silicon carbide semiconductor layer 2, the PN junction (hereinafter referred to as the side face side PN junction) between the trench 70 and the trench 5 is electrically separated from the PN junction (hereinafter referred to as the cell side PN junction) between the trench 70 and the trench 7. The trench 70 is formed to have the same thickness with or to be shallower than that of the trench 7, so that the concentration of an electric field in the thermal oxide film 9 formed in the trench 70 is lessened.

Figure 11:
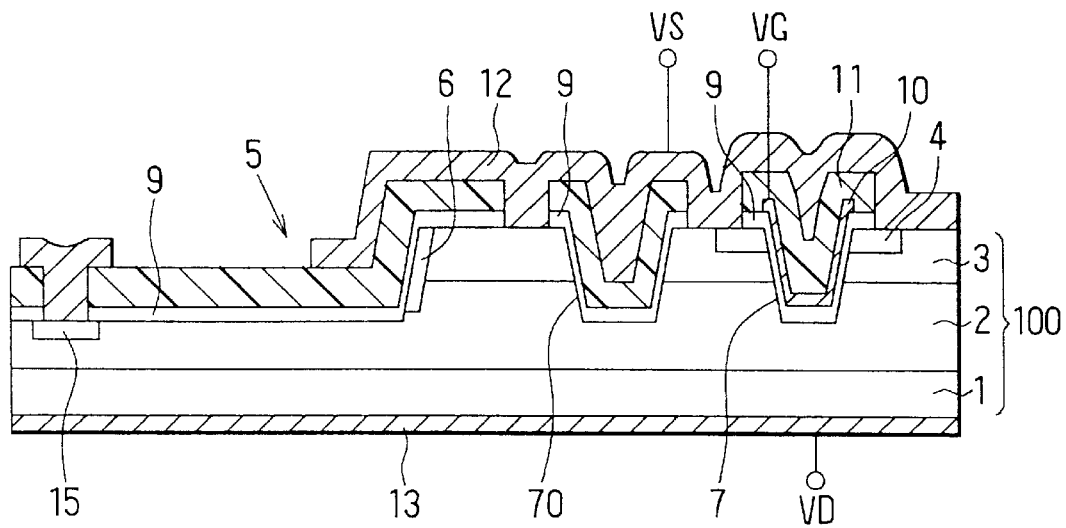
FIG. 11 is a sectional view of a vertical power MOSFET according to a fifth embodiment of the invention.
Figure 12:
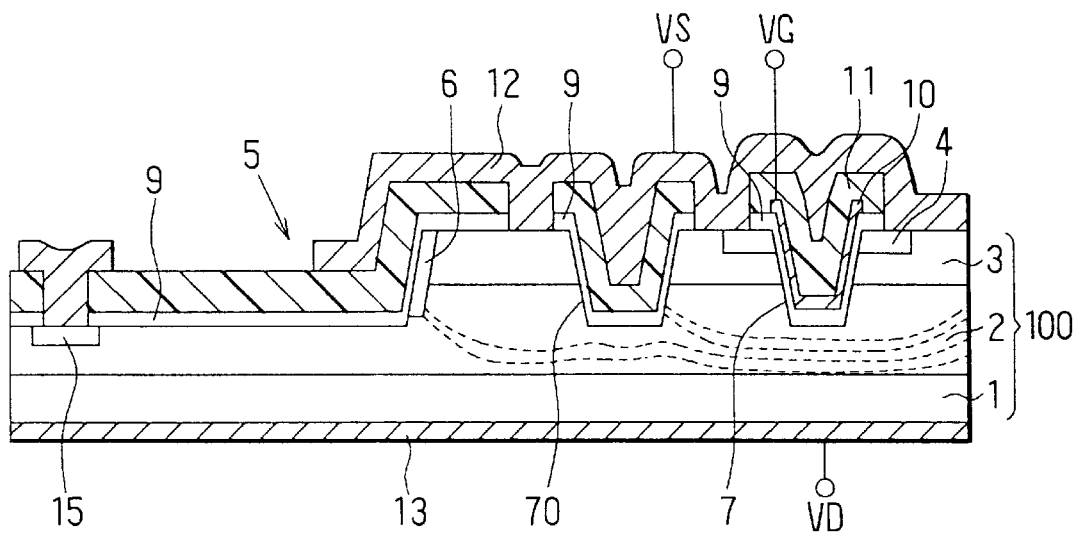
FIG. 12 is a sectional view showing a distribution of an electric field of the vertical power MOSFET shown in FIG. 11.

FIG. 12 shows a distribution of the electric field when the vertical power MOSFET shown in FIG. 11 is in operation. The electric field is distributed as shown in FIG. 12, when the PN junction of the side face side of the trench 5 is electrically isolated from the PN junction of the cell region side, because the channel forming region can be separated from the region for giving a withstand voltage to the device. Because an avalanche breakdown current flows through the PN junction of the side face side when a high voltage is applied to the drain electrode 13, a breakdown of the device hardly occurs in the PN junction of the cell region side. As a result, it can prevent the avalanche breakdown current from flowing through the cell region and prevent the cell region from being damaged by the avalanche breakdown current, so that the durability of the vertical power MOSFET can be enhanced.

(Sixth Embodiment)

Figure 13:
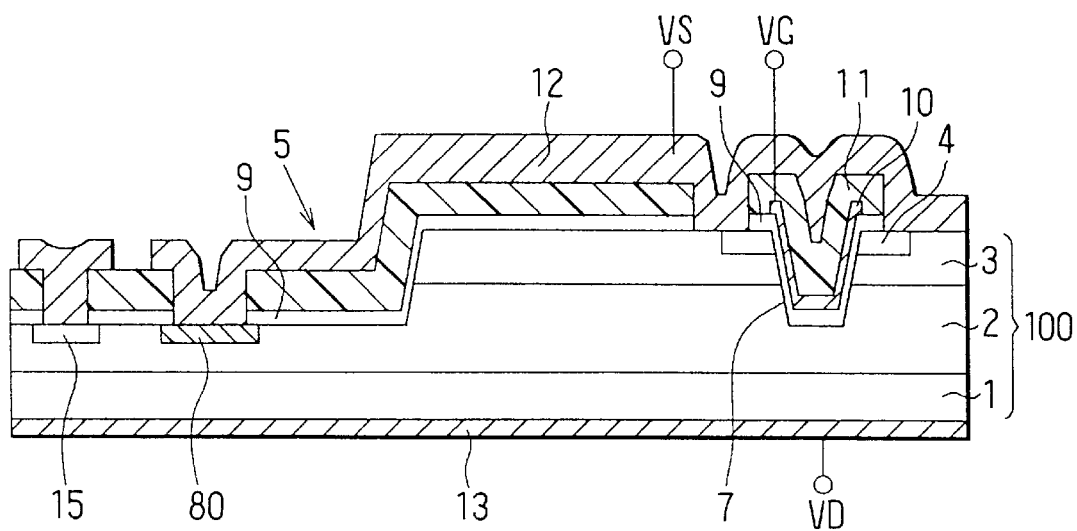
FIG. 13 is a sectional view of a vertical power MOSFET according to a sixth embodiment of the invention.

A sixth embodiment of the present invention will be explained below with reference to FIG. 13.

While the n⁻-type silicon carbide semiconductor layer 6 was formed on the side face of the trench 5 forming the mesa structure to prevent the concentration of the electric field at the side face of the trench 5 and to prevent the dielectric breakdown of the thermal oxide film 9 in the first embodiment described above, a p-type silicon carbide semiconductor layer 80 is formed on the surface layer portion of the n⁻-type silicon carbide semiconductor layer 2 located at the bottom of the trench 5 to prevent the dielectric breakdown of the thermal oxide film 9 by causing a breakdown at the p-type silicon carbide semiconductor layer 80 before the dielectric breakdown of the thermal oxide film 9 occurs.

Specifically, the p-type silicon carbide semiconductor layer 80 is formed on a side of the cell region rather than the n⁺-type silicon carbide semiconductor layer 15 in the vertical power MOSFET of the present embodiment. Then, the source electrode 12 is extended to the inside of the trench 5 to electrically conduct the n⁺-type source region 4 with the p-type silicon carbide semiconductor layer 80 via a contact hole formed in the insulating film 11 and the thermal oxide film 9. That is, the potential of the n⁺-type source region 4 is equalized with that of the p-type silicon carbide semiconductor layer 80.

As for the thickness of the n⁻-type silicon carbide semiconductor layer 2, a thickness L2 of the part where the trench 5 is not formed is thicker than a thickness L1 of the part where the trench 5 is formed. It means that the withstand voltage of the n⁻-type silicon carbide semiconductor layer 2 is large at the part where the thickness is L2 rather than the part where the thickness is L1.

Accordingly, when a PN junction (hereinafter referred to as an auxiliary junction) between the p-type silicon carbide semiconductor layer 80 and the n⁻-type silicon carbide semiconductor layer 2 is compared with the PN junction (hereinafter referred to as a main junction) between the p-type silicon carbide semiconductor layer 3 and the n⁻-type silicon carbide semiconductor layer 2, an avalanche is breakdown occurs at the auxiliary junction with a voltage lower than the voltage with which an avalanche breakdown occurs at the main junction.

Because the breakdown of the auxiliary junction occurs in the outside region distant from the cell region, the dielectric breakdown of the thermal oxide film 9 at the side face of the trench 5 forming the mesa structure can be prevented. Further, because the breakdown at the part where the avalanche breakdown has occurred is the breakdown in the semiconductor, differing from the dielectric breakdown of the thermal oxide film 9, the vertical power MOSFET will not fail even after the breakdown. Therefore, the vertical power MOSFET can be what hardly causes a permanent failure.

(Seventh Embodiment)

A seventh embodiment of the present invention will be explained below with reference to FIG. 14. A structure which can prevent the dielectric breakdown of the thermal oxide film 9 at the corner of the trench 5 formed at the peripheral edge of the cell region will be explained in the present embodiment.

Figure 14:
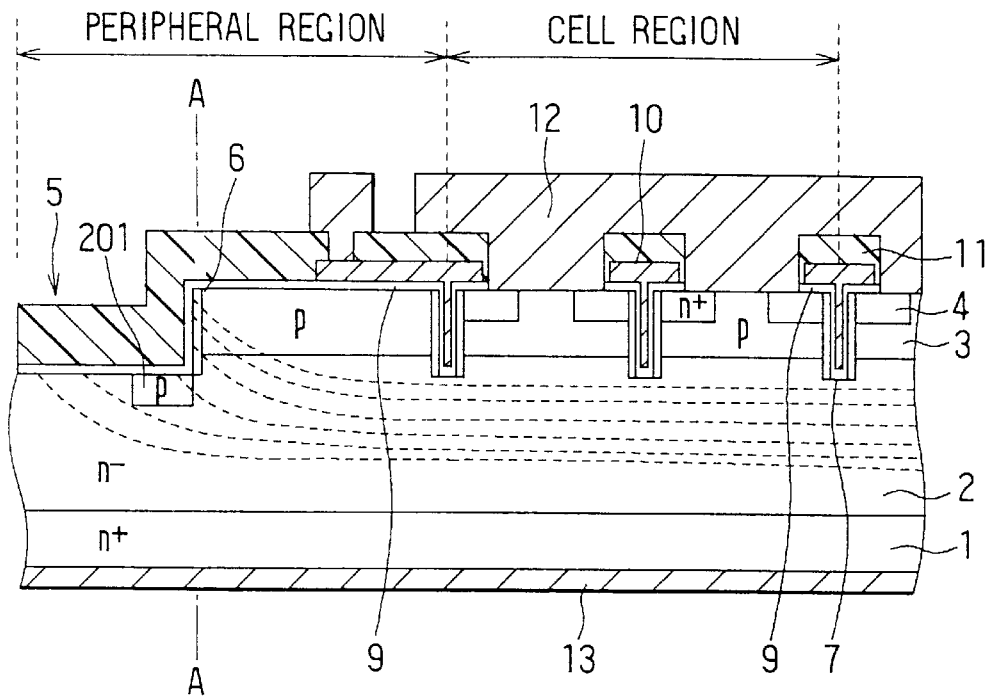
FIG. 14 is a sectional view of a vertical power MOSFET according to a seventh embodiment of the invention.

As shown in FIG. 14, a p-type layer region 201 is formed at the region (corner part of the trench) closest to the cell region in the bottom of the trench 5 formed in a trench gate type vertical power MOSFET. Because the p-type layer region 201 functions as a guard ring, a depletion layer may be expanded around the p-type layer region 201 as shown by equipotential lines (dot lines) in FIG. 14.

Figure 15A:
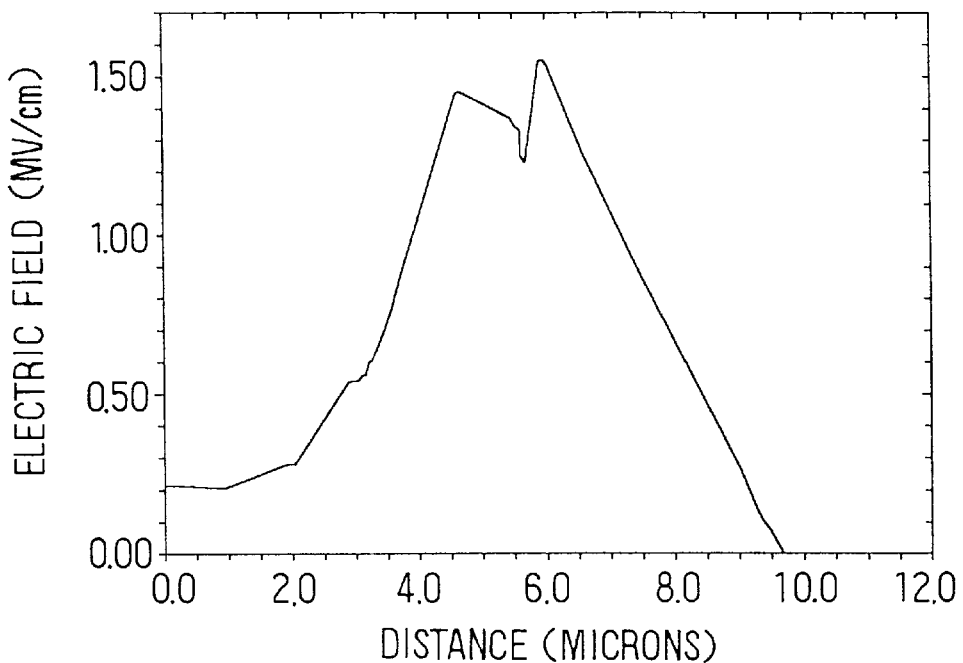
FIGS. 15A and 15B are graphs showing a distribution of an electric field in the vertical power MOSFET shown in FIG. 14 and that of a conventional vertical power MOSFET, respectively.
Figure 15B:
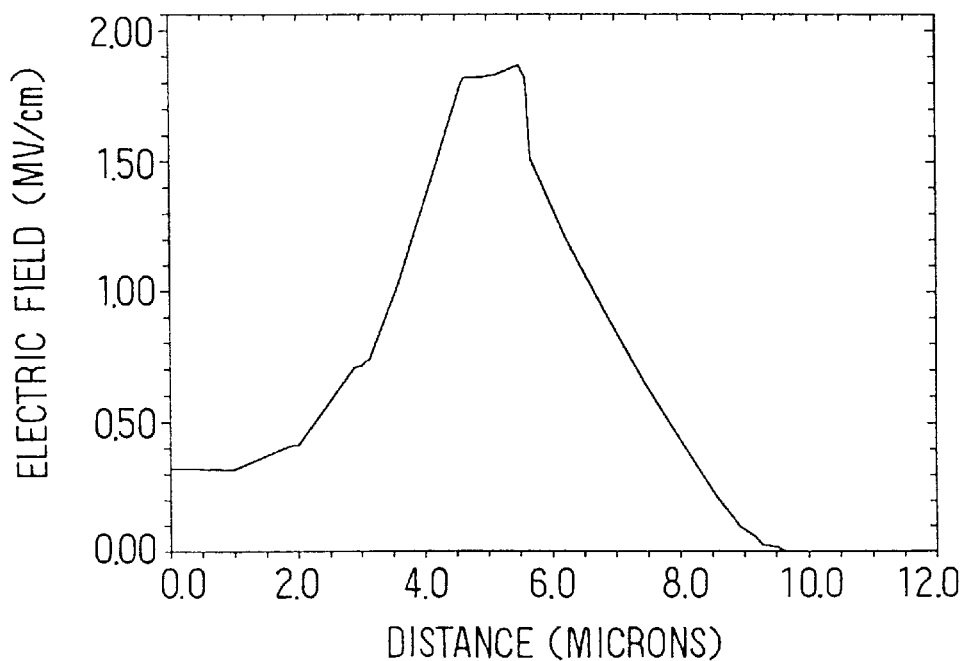
Figure 38:
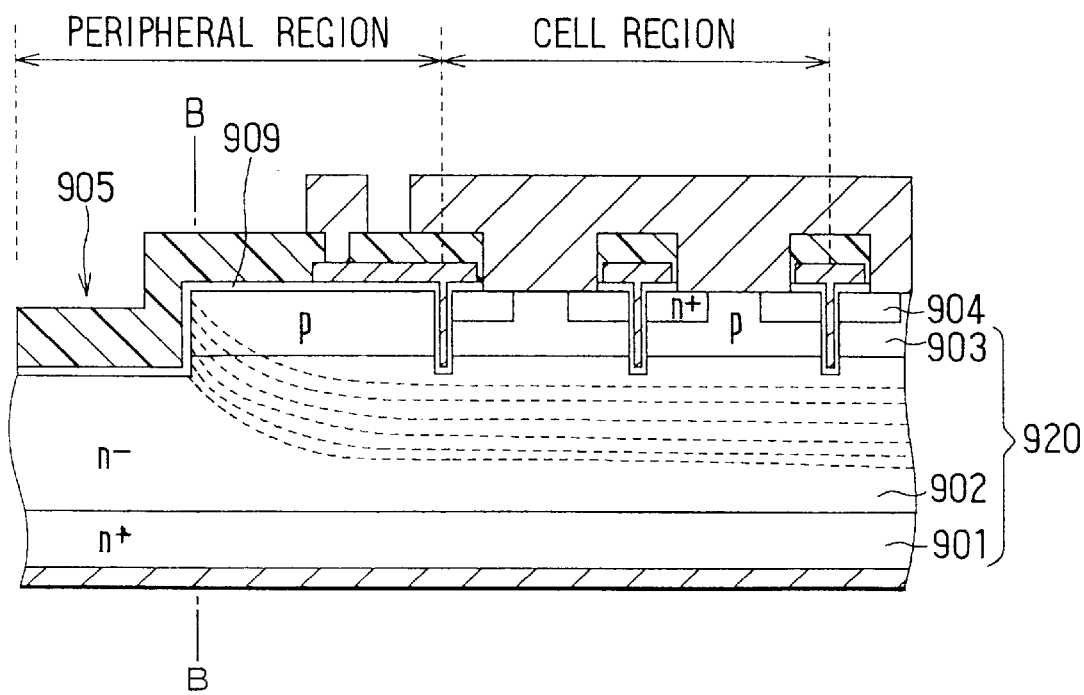
FIG. 38 is a sectional view showing a distribution of an electric field in a conventional vertical type power MOSFET having a mesa structure.

When a distribution of an electric field at section A—A in FIG. 14 and a distribution of an electric field at section B—B in FIG. 38 were detected, results as shown in FIGS. 15A and 15B were obtained, respectively. As it is apparent from these graphs, the maximum field strength of the distribution of the electric field at the corner part of the trench 5 is low and the concentration of electric field is relaxed when the p-type layer region 201 is formed, compared to the prior art in which the p-type layer region 201 is not formed.

Therefore, the concentration of the electric field at the corner of the trench 5 can be relaxed, preventing the dielectric breakdown of the thermal oxide film 9 at this part. As a result, the withstand voltage of the semiconductor device can be enhanced.

It is noted that although the p-type layer region 201 is formed only at the bottom part of the corner of the trench 5 in the present embodiment, the concentration of the electric field can be relaxed more by forming it so as to cover the whole of the corner.

Further, while the case when the side face of the trench 5 is almost vertical relative to the surface of the substrate, i.e. the case in which the concentration of the electric field is liable to occur most at the corner of the trench 5, is shown in the present embodiment, the present embodiment may be applied also to the case when the side face of the trench 5 is inclined.

Next, a method for manufacturing the vertical power MOSFET shown in FIG. 14 will be explained with reference to FIGS. 16A through 16C. It is noted that only steps different from the method for manufacturing the vertical power MOSFET shown in the first embodiment will be explained and steps common to them will be omitted here. Further, the method will be explained here by exemplifying the case when the side face of the trench 5 is almost vertical relative to the surface of the substrate, i.e. the case in which the concentration of the electric field is liable to occur at the corner of the trench 5.

Figure 16A:
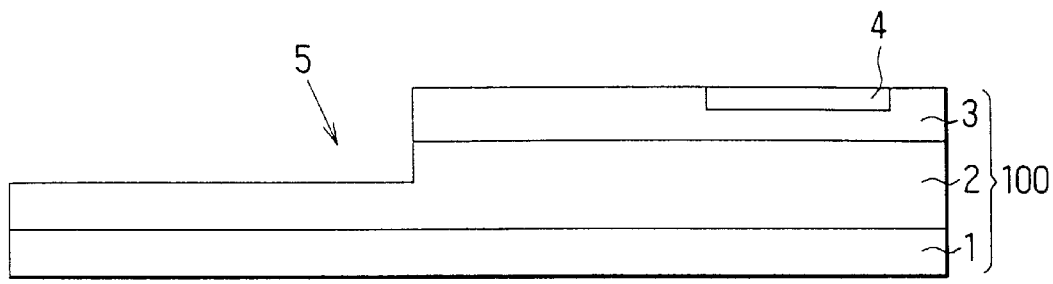
FIGS. 16A through 16C are sectional views showing steps for manufacturing the vertical power MOSFET shown in FIG. 14.

At first, after undergoing the step shown in FIG. 3A, dry etching is performed to form the trench 5 which penetrates through the p-type silicon carbide semiconductor layer 3 and reaches the n⁻-type silicon carbide semiconductor layer 2 as shown in FIG. 16A.

Figure 16B:
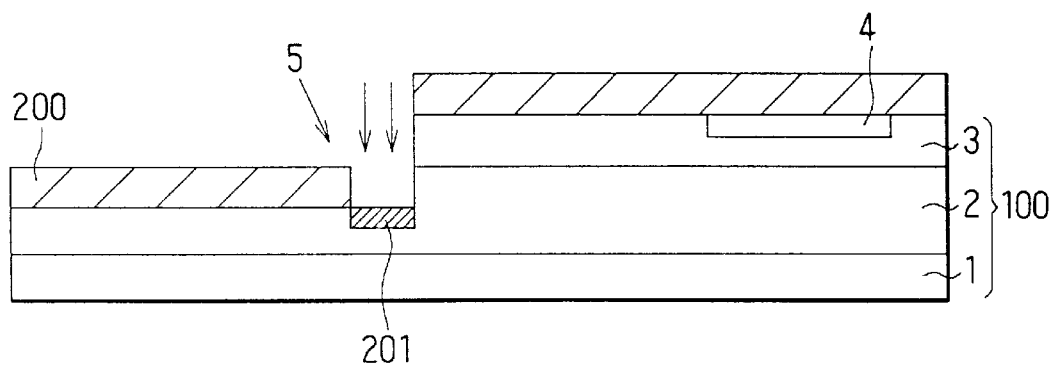

Next, after undergoing the photolithography process and after covering the region other than the corner portion of the trench 5 with a mask member 200, p-type impurity is ion-implanted to form a p-type layer region 201 as shown in FIG. 16B.

Figure 16C:
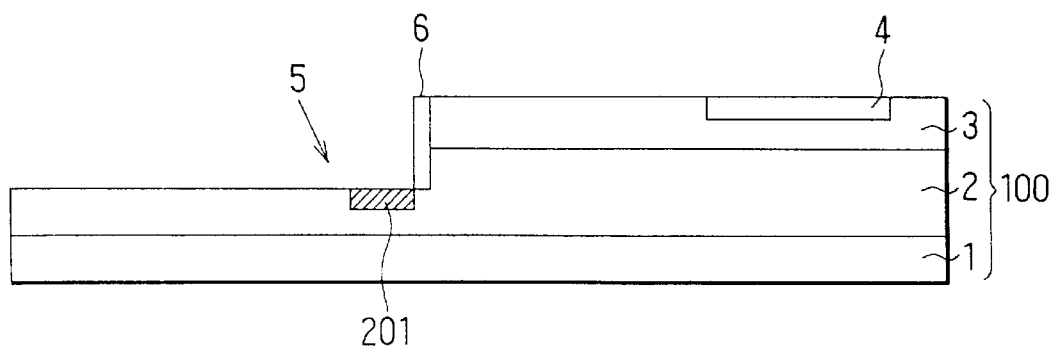

Then, the high resistance layer 6 made of the n⁻-type silicon carbide semiconductor is formed on the side face of the trench 5 by forming an epitaxial growth layer and by oxidizing the epitaxial growth layer as shown in FIG. 16C. Then, the vertical power MOSFET of the present embodiment is completed by undergoing the steps shown in FIGS. 4A through 4C and FIGS. 5A through 5C.

(Eighth Embodiment)

Figure 17:
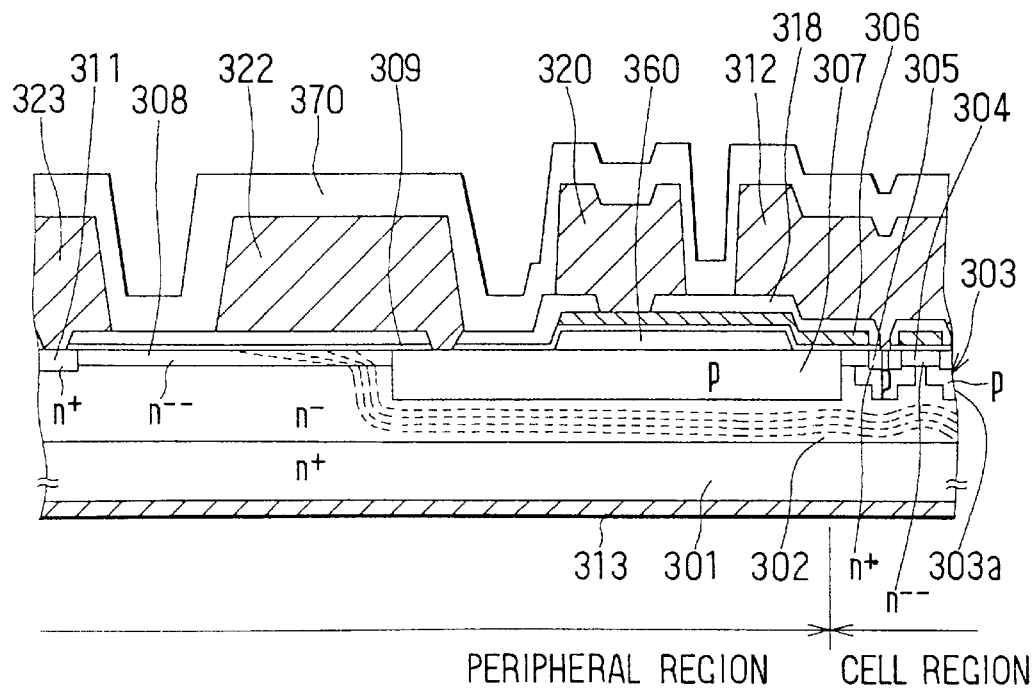
FIG. 17 is a sectional view of a vertical power MOSFET according to an eighth embodiment of the invention.

An eighth embodiment of the present invention will be explained below. The present embodiment is arranged so as to enhance the withstand voltage of the semiconductor device when the field plate structure is adopted in the peripheral region of the cell region. FIG. 17 shows the silicon carbide semiconductor device of the present embodiment.

As shown in FIG. 17, a planar type MOSFET is formed in the cell region in the present embodiment. As compared to the trench gate type MOSFET shown in FIG. 1, the structure of the planar power MOSFET is different in that a thin film layer 304 for forming a channel is formed on the surface layer portion of the substrate. However, the other components are almost the same, so that only the difference points will be explained in detail below and an explanation of the same components will be omitted here.

The planar type MOSFET comprises a substrate which is composed of an n$^+$-type silicon carbide semiconductor substrate 301 and an n$^-$-type silicon carbide semiconductor layer 302. In the surface layer portion of the n$^-$-type silicon carbide semiconductor layer 302, a plurality of p-type silicon carbide semiconductor layers (hereinafter referred to as p-type base regions) 303, and a surface channel layer 304 formed to be parallel to the surface of the substrate are provided. When a positive voltage is applied to a gate electrode layer 306, a channel is formed in the surface channel layer 304, thus performing an operation as a transistor. The semiconductor device also comprises a source electrode 312, a drain electrode 313 and a gate electrode 320 which is electrically connected to the gate electrode layer 306.

There are also provided a p-type region 307 for preventing a breakdown and an electrode 322 functioning as the field plate in the peripheral region of the cell region. The p-type region 307 is formed on the surface layer portion of the n$^-$-type epitaxial layer 302 and contacts with the electrode 322 via a contact hole formed in insulating films 309, 318.

The electrode 322 extends toward the side distant from the cell region. Because this electrode 322 becomes an equipotential region, a depletion layer extends toward the periphery of the cell region, thus allowing to enhance the withstand voltage.

An n$^{--}$-type thin film layer (thin film semiconductor layer) 308 whose impurity concentration is lower than that of the n$^-$-type epitaxial layer 302 is provided below the electrode 322 and above the n$^-$-type epitaxial layer 302. In detail, while the impurity concentration of the n$^-$-type epitaxial layer 302 is $2 \times 10^{16}$ cm$^{-3}$, the impurity concentration of the n$^{--}$-type thin film layer 308 is $1 \times 10^{15}$ cm$^{-3}$. The thickness of the n$^{--}$-type thin film layer 308 is 0.3 µm. A width of the n$^{--}$-type thin film layer 308 in a direction distant from the cell region is set such that the depletion layer terminates within the n$^{--}$-type thin film layer 308 even when a reverse bias voltage is applied between the drain electrode 313 and the source electrode 312. It is noted that the n$^{--}$-type thin film layer 308 is formed so as to surround the cell region in the peripheral region of the semiconductor device.

Equipotential lines are shown by dotted lines in FIG. 17 when the reverse bias voltage is applied to the planar power MOSFET thus constructed. Because the n$^{--}$-type thin film layer 308 is formed so that the impurity concentration of the n$^{--}$-type thin film layer 308 is lower than that of the n$^-$-type epitaxial layer 302 as described above, the extension of the depletion layer in a transverse direction of the substrate can be increased when the reverse bias voltage is applied as described above.

Figure 18A:
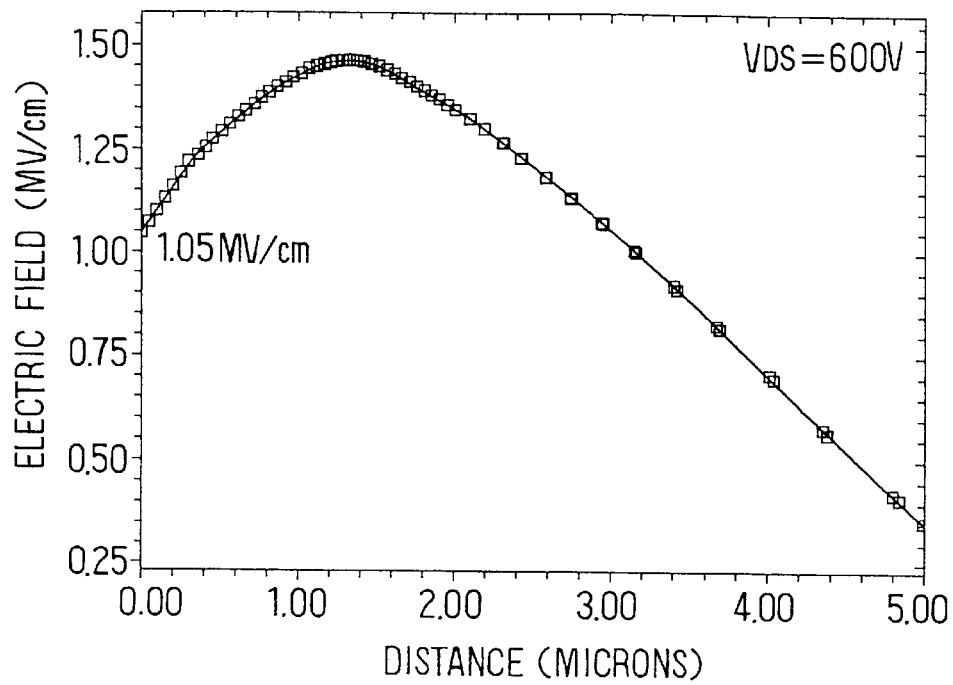
FIGS. 18A and 18B are graphs showing a distribution of an electric field of the vertical power MOSFET shown in FIG. 17 and that of the conventional vertical power MOSFET, respectively.
Figure 18B:
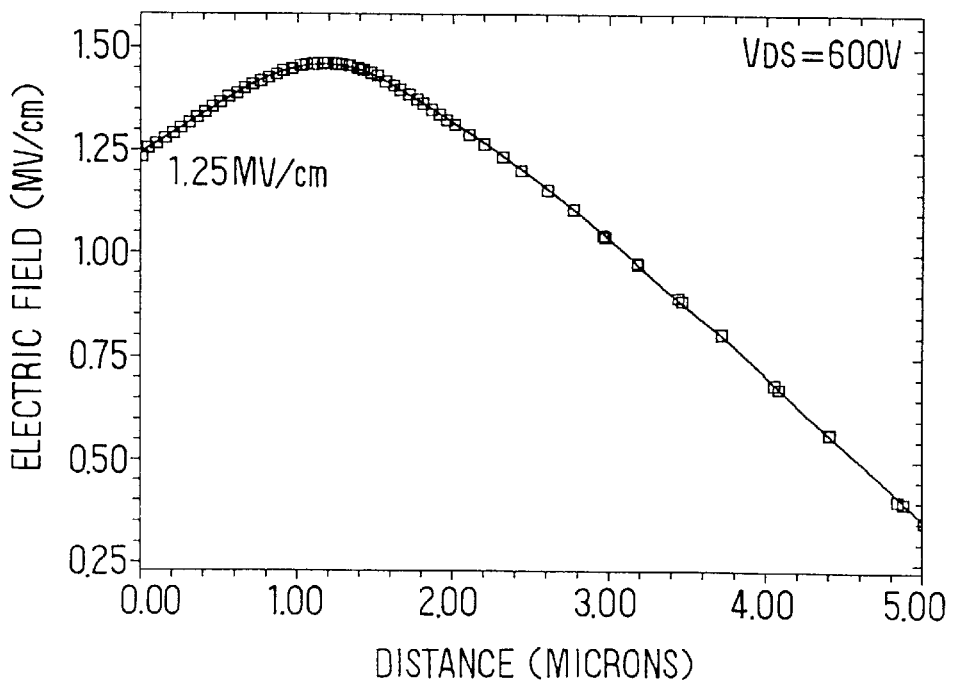

FIGS. 18A and 18B show measured maximum field strength in a depth direction of the substrate below the field plate in the case where the n$^{--}$-type thin film layer 308 is formed and in the case not formed.

When the distance shown in FIGS. 18A and 18B is zero (Distance=0), i.e., when the maximum field strength at the interface of the thermal oxide film 309 is compared in those graphs, it can be seen that the maximum field strength could be reduced by about 20% by forming the n$^{--}$-type thin film layer 308 since it is 1.05 MV/cm in FIG. 18A, though it is 1.25 MV/cm in FIG. 18B.

As described above, the field strength at the interface of the thermal oxide film 309 can be reduced. Therefore, a dielectric breakdown of the thermal oxide film 309 can be prevented.

The p-type base region 303 is formed so that its junction depth is partially deep. The formation of the region (second base region) 303a where the junction depth is deep allows a curvature of the bottom of the p-type base region 303 to be reduced. Therefore, the field strength at the bottom of the p-type base region 303 can be enhanced. As a result, an avalanche breakdown can be caused readily in this region 303a and the withstand voltage of the planar type MOSFET can be decided by the second base region 303a of the p-type base region 303. It is noted that, because the position for forming the region 303a can be arbitrarily set, it may be formed at a position where a parasitic transistor formed in the planar MOSFET hardly operates. Thereby, its inverse excitation energy raggedness in driving an inductive load may be enhanced.

It is noted that an n$^+$-type region 311 and an electrode 323 connected to the n$^{--}$-type thin film layer 308 shown in FIGS. 17, 20 and 21 are what are called an equipotential ring (EQR) which equalizes potential of the semiconductor device at the periphery thereof across the whole region of the semiconductor device. Basically, these are formed so as to surround the cell region in the periphery of the semiconductor device and the potential thereof is floating potential. Although the n$^+$-type region 311 is connected with the n$^{--}$-type thin film layer 308 in the present embodiment, they may be separated from each other.

Next, steps for manufacturing the planar type power MOSFET shown in FIG. 17 will be explained based on FIGS. 19A through 19C, FIGS. 20A through 20C and FIGS. 21A and 21B.

Figure 19A:
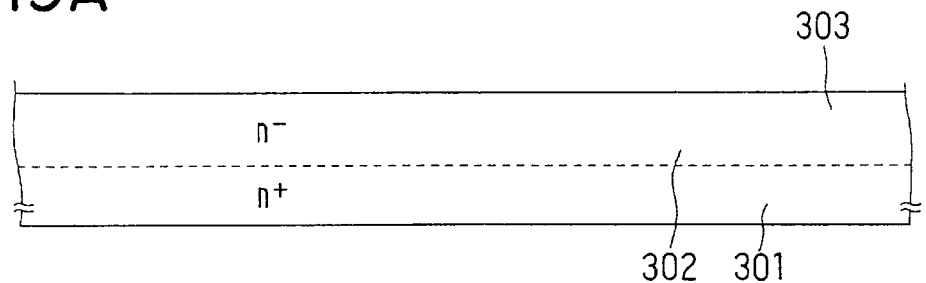
FIGS. 19A to 19C, 20A to 20C, 21A and 21B are sectional views showing steps for manufacturing the vertical power MOSFET shown in FIG. 17.

[Step Shown in FIG. 19A]

The low resistance n$^+$-type silicon carbide semiconductor substrate 301 is prepared and the high resistance n$^-$-type silicon carbide semiconductor layer 302 is grown epitaxially on the n$^+$-type silicon carbide semiconductor substrate 301.

Figure 19B:
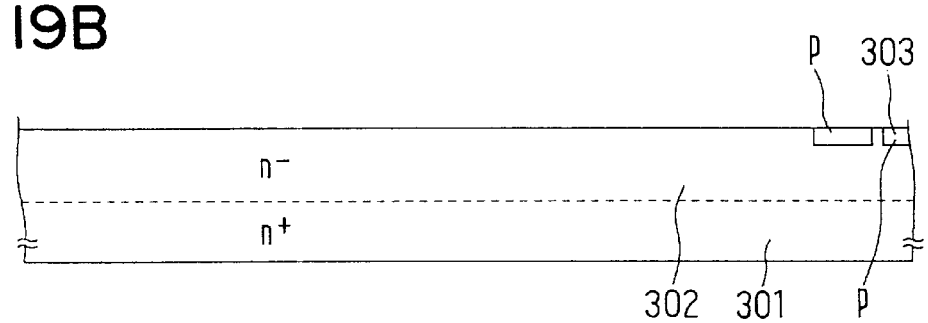

[Step Shown in FIG. 19B]

Ions are implanted to the region where the cell is to be formed in the surface layer portion of the n$^-$-type silicon carbide semiconductor layer 302 to form the p-type base region 303.

Figure 19C:
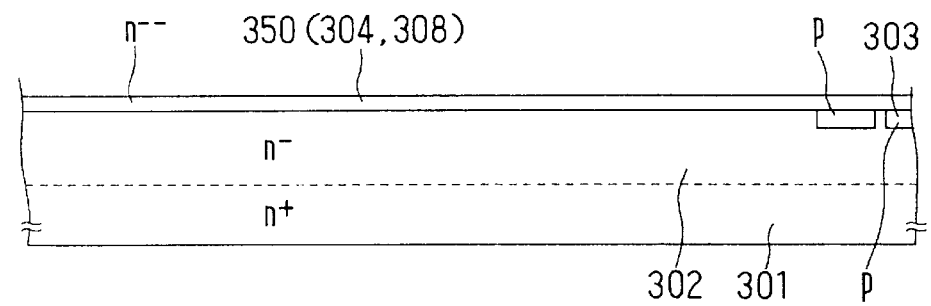

[Step Shown in FIG. 19C]

The n$^{--}$-type thin film layer 350 whose impurity concentration is lower than that of the n$^-$-type silicon carbide semiconductor layer 302 is formed on the n$^-$-type silicon carbide semiconductor layer 302 including the p-type base region 303 by means of epitaxial growth. This n$^{--}$-type thin film layer 350 forms the surface channel layer 304 for forming a channel and forms the n$^{--}$-type thin film layer 308 which functions to reduce the field strength at the interface of the thermal oxide film 309.

The n$^{--}$-type thin film layer 308 may be formed without adding another step, as compared to the prior art, by performing the step of forming the surface channel layer 304 for forming the channel and the step for forming the n$^{--}$-type thin film layer 308 at the same time.

Figure 20A:
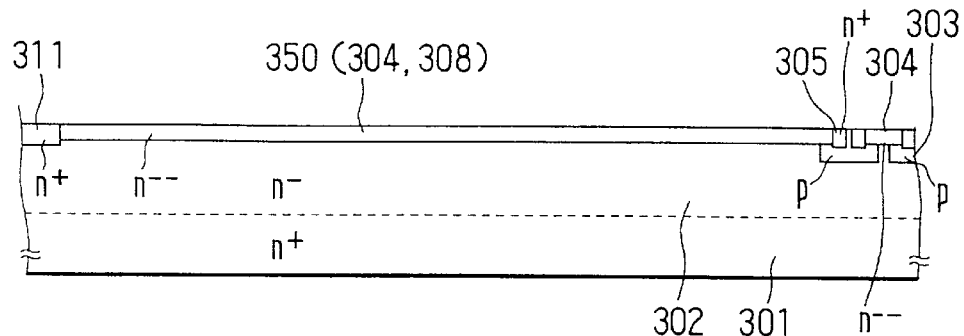

[Step Shown in FIG. 20A]

Then, n-type impurity is ion-implanted to form the n$^+$-type source layer 305 in the predetermined region on the p-type base region 303 and to form the n$^+$-type region 311 for contact in the predetermined region of the peripheral region.

Figure 20B:
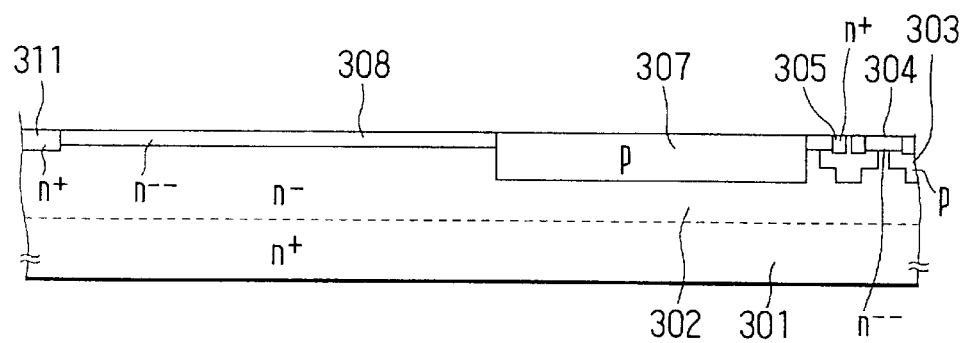

[Step Shown in FIG. 20B]

Then, p-type impurity is ion-implanted. That is, a part of the n$^{--}$-type thin film layer 304 on the p-type base region 303 other than the part where the channel is to be formed is inverted to p-type (between the n⁺-type source layers 305 in the figure) so that a contact can be made with the p-type base region 303 in the unit cell region. Also, the p-type region 307 for preventing a breakdown is formed in the peripheral region.

At this time, the p-type impurity is ion-implanted so that the impurity is implanted deeply more than the p-type base region 303. Thereby, the p-type base region 303 has a region 303a partially deeply formed. As a result, an avalanche breakdown may be readily caused in the region 303a which is formed deeply in the p-type base region 303. The position where the region 303a is formed may be arbitrarily changed by changing the masking position in implanting the ions.

It is noted that, although the region 303a is formed here, whether or not to form the region 303a is arbitrary and the region 303a may not be formed. In such a case, the step for forming the p-type region 307 may be simplified by forming the p-type region 307 and the p-type base region 303 at the same time, so that the manufacturing process of the semiconductor device may be simplified. Further, it is also possible to form the p-type region 307 at the same time with the p-type base region 303 and to form the necessary part of the p-type region 307 at the same time with the region 303a to deepen the junction depth of that part.

Figure 20C:
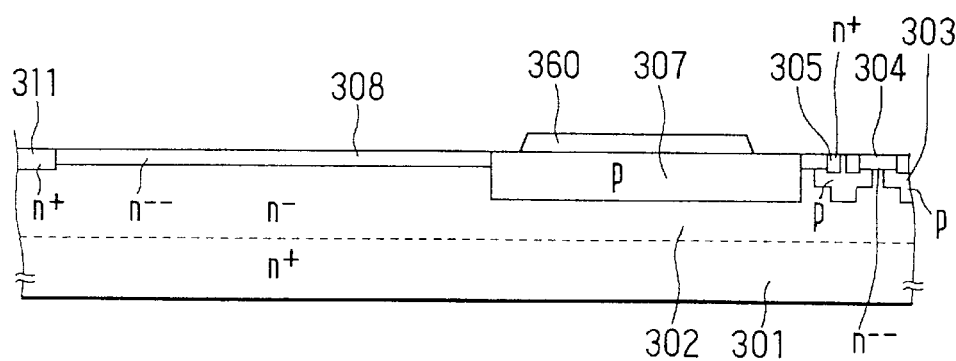

[Step Shown in FIG. 20C]

An oxide film ($SiO_2$) 360 having a certain thickness is formed on the p-type region 307 through a photolithography step.

Figure 21A:
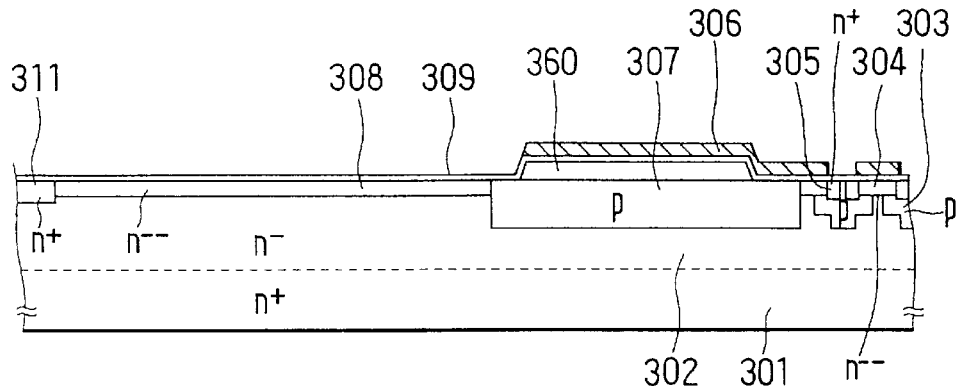

[Step Shown in FIG. 21A]

The thermal oxide film 309 is formed on the entire surface of the wafer by means of thermal oxidation. The thermal oxide film 309 turns to be a gate oxide film. Then, the gate electrode 306 is formed by patterning it after depositing poly-silicon or the like.

Figure 21B:
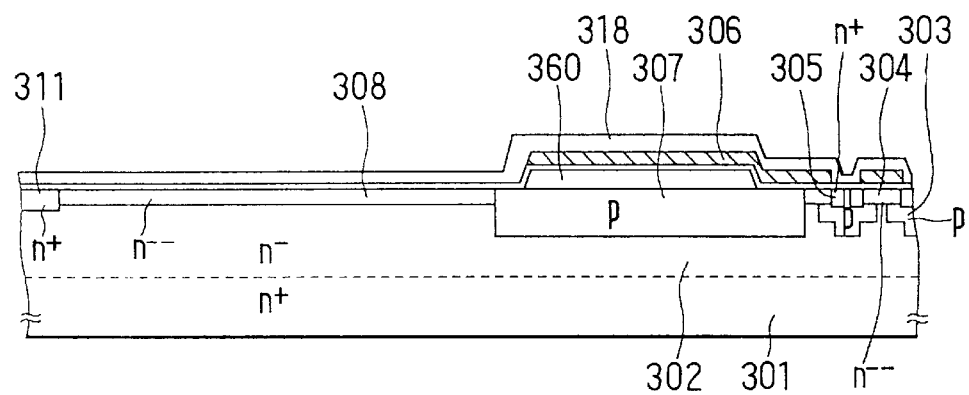

[Step Shown in FIG. 21B]

An interlayer insulating film 318 is formed on the wafer including the thermal oxide film 309.

Then, after forming contact holes in the interlayer insulating film 318 and the thermal oxide film 309, an aluminum wire is patterned and a gate electrode 320, the source electrode 312 and the electrode 322 which turns to be the field plate are formed. Then, a passivation film 370 is formed on the gate electrode 320, the source electrode 312 and the electrode 322, and the drain electrode 313 is formed on the back of the wafer, thus completing the planar type power MOSFET shown in FIG. 17.

(Ninth Embodiment)

Figure 22:
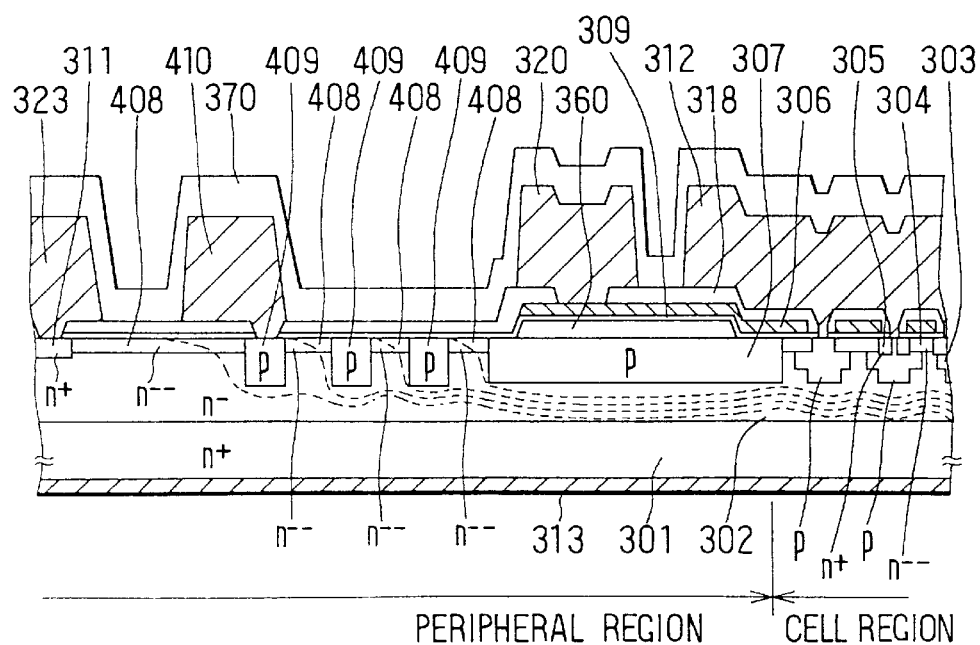
FIG. 22 is a sectional view of a vertical power MOSFET according to a ninth embodiment of the present invention.

An ninth embodiment of the present invention will be explained below. According to the present embodiment, the withstand voltage of the semiconductor device can be enhanced by adopting the guard ring structure in the peripheral region of the cell region. FIG. 22 shows the silicon carbide semiconductor device of the present embodiment.

As shown in FIG. 22, a planar type MOSFET is formed in the cell region in the present embodiment. Because the overall structure of the planar type power MOSFET is the same as that shown in FIG. 17, the same components are denoted by the same reference numerals with those in FIG. 17 and an explanation thereof will be omitted here.

The p-type region 307 for preventing a breakdown and a plurality of p-type regions 409 each of which has a predetermined width and which forms the guard ring are provided in the peripheral region of the cell region so as to surround the cell region. The p-type region 307 and the p-type regions 409 are formed on the surface layer portion of the n⁻-type silicon carbide semiconductor layer 302. The p-type regions 409 are disposed at predetermined distances toward the side distant from the unit cell region from the p-type region 307.

Then, the one which is distant most from the cell region among the p-type regions 409 is connected electrically with an electrode 410 which forms the field plate.

Further, n⁻⁻⁻-type thin film layers 408 whose impurity concentration is lower than that of the n⁻-type silicon carbide semiconductor layer 302 are provided on the n⁻-type silicon carbide semiconductor layer 302 between the plurality of p-type regions 409 forming the guard ring structure, between the p-type region 307 and the p-type region 409, and between n⁻-type layer 311 and the p-type region 409 which is located at the outermost periphery among the plurality of p-type regions 409. In detail, the impurity concentration of the n⁻⁻⁻-type thin film layer 408 is set to $1\times10^{16}$ cm$^{-3}$ and the thickness thereof is 0.3 μm.

When a high voltage is applied to the drain of the planar type power MOSFET thus constructed, equipotential lines of a distribution of an electric field are shown by dotted lines in FIG. 22. That is, because the n⁻⁻⁻-type thin film layer 408 is formed and its impurity concentration is lower than that of the n⁻-type epitaxial layer 302 as described above, the extension of the depletion layer may be increased in a transverse direction of the semiconductor device.

Therefore, the field strength at the interface of the thermal oxide film 309 can be reduced, and a dielectric breakdown of the thermal oxide film 309 can be prevented.

Next, steps for manufacturing the planar type power MOSFET shown in FIG. 22 will be explained based on FIGS. 23A through 23C, FIGS. 24A through 24C and FIGS. 25A through 25C.

Figure 23A:
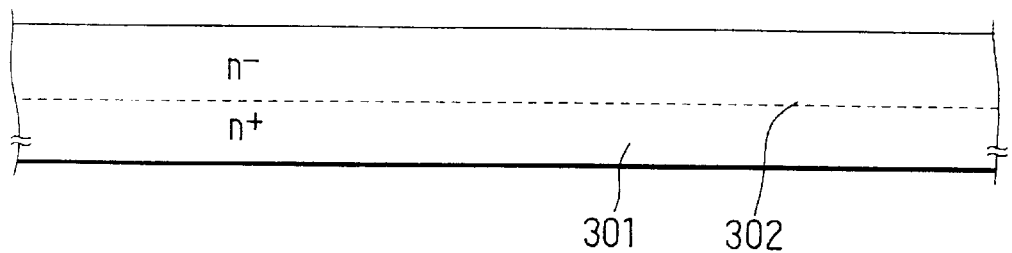
FIGS. 23A to 23C, 24A to 24C, 25A and 25B are sectional views showing steps for manufacturing the vertical power MOSFET shown in FIG. 22.

[Step Shown in FIG. 23A]

The low resistance n⁺-type silicon carbide semiconductor substrate 301 is prepared and the high resistance n⁻-type silicon carbide semiconductor layer 302 is grown epitaxially on the n⁺-type silicon carbide semiconductor substrate 301.

Figure 23B:
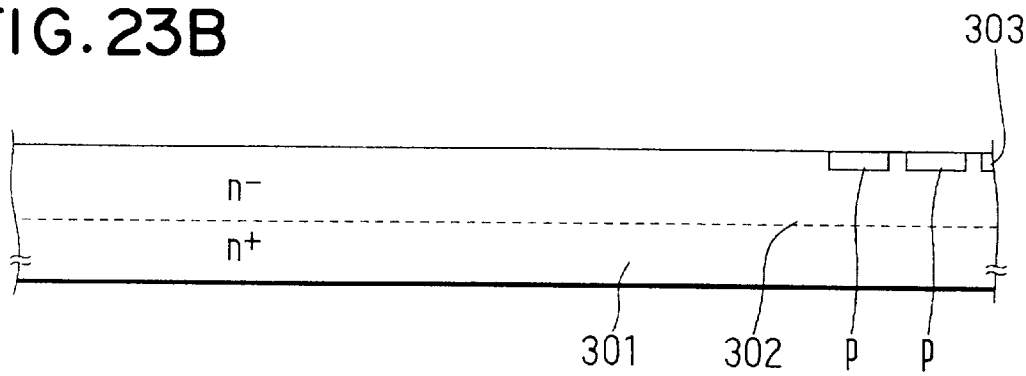

[Step Shown in FIG. 23B]

The p-type base regions 303 are formed in the region where the unit cell is to be formed in the surface layer portion of the n⁻-type silicon carbide semiconductor layer 302.

Figure 23C:
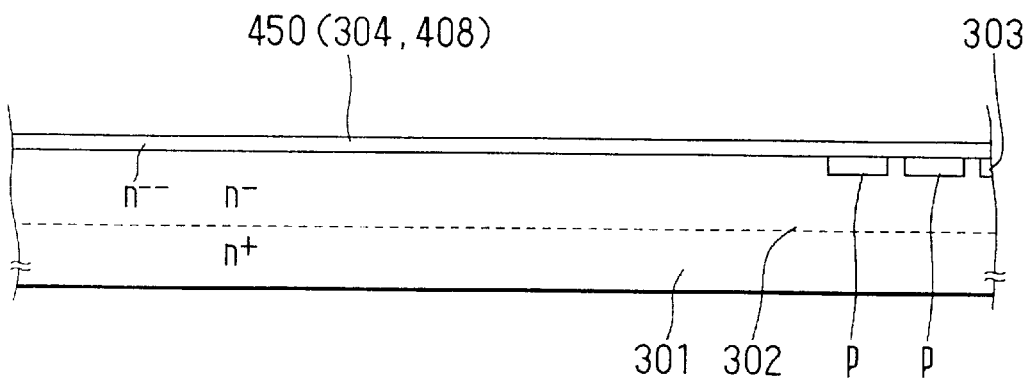

[Step Shown in FIG. 23C]

An n⁻⁻⁻-type thin film layer 450 is formed on the n⁻-type silicon carbide semiconductor layer 302 including the p-type base regions 303 by means of epitaxial growth. This n⁻-type thin film layer 450 forms the surface channel layer 304 for forming a channel and the n⁻⁻⁻-type thin film layer 408 which plays the role of reducing the field strength at the interface of the thermal oxide film 309 as described above.

Figure 24A:
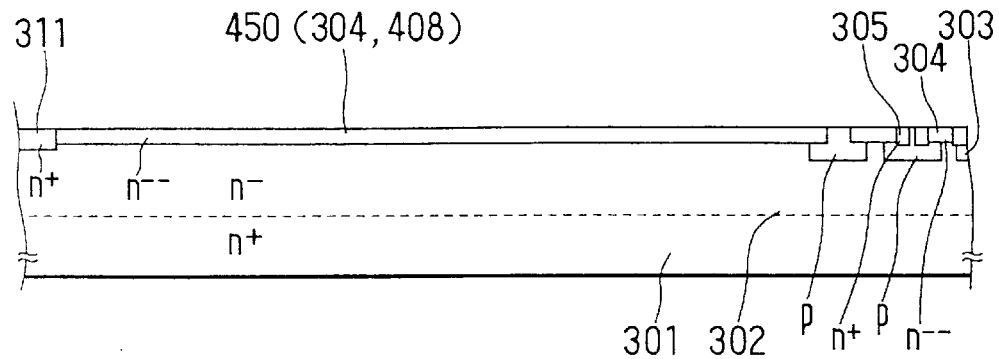

[Step Shown in FIG. 24A]

Then, n-type impurity is ion-implanted to form the n⁺-type source layers 305 in the predetermined region on the p-type base regions 303 and the n⁺-type region 311 for contact in the predetermined region of the peripheral region.

Figure 24B:
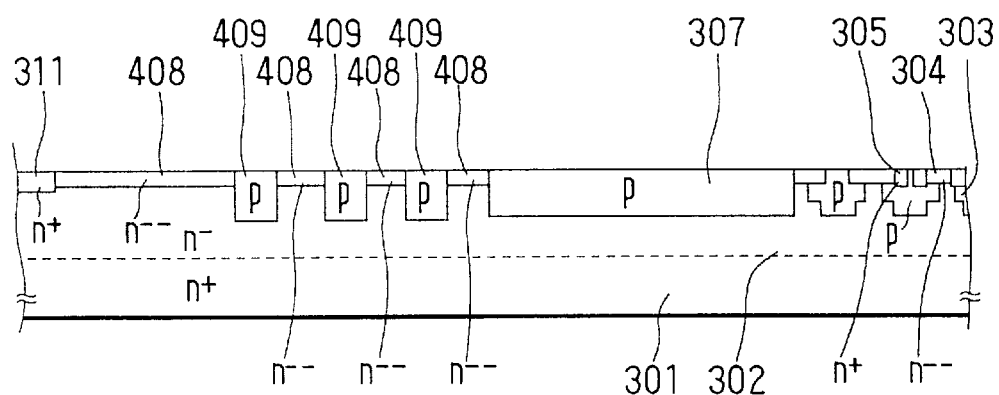

[Step Shown in FIG. 24B]

Then, p-type impurity is ion-implanted in the predetermined regions. That is, a part of the n⁻⁻⁻-type thin film layer 304 on the p-type base region 303 other than the part where the channel is to be formed is inverted to p-type (between the n⁺-type source layers 305 in the figure) so that a contact can be made with the p-type base region 303 in the unit cell region. The p-type region 307 for preventing a breakdown is formed in the peripheral region and the plurality of p-type regions 409 which form the guard ring structure are formed toward the side distant from the unit cell region from the p-type region 307.

At this time, a part of the p-type base region 305 may be formed deeply. That is, the withstand voltage of the device may be enhanced by ion-implanting the p-type impurity deeply more than the p-type base region 305.

Figure 24C:
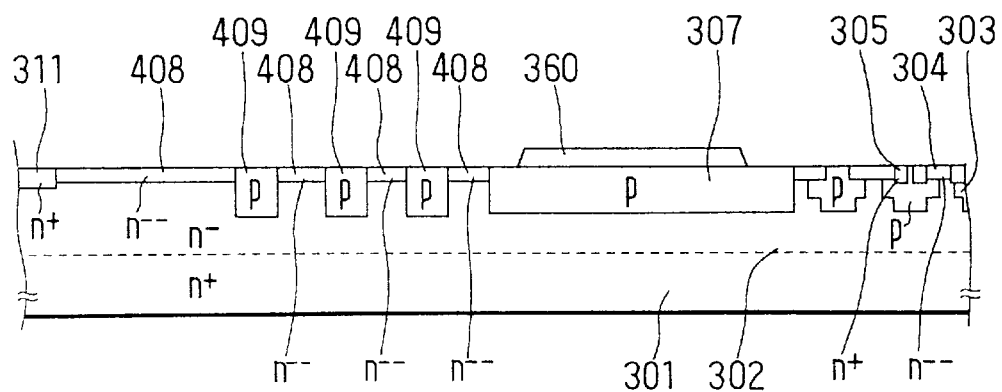

[Step Shown in FIG. 24C]

The oxide film (SiO$_2$) 360 having a certain thickness is formed on the p-type region 307 through a photolithography step.

Figure 25A:
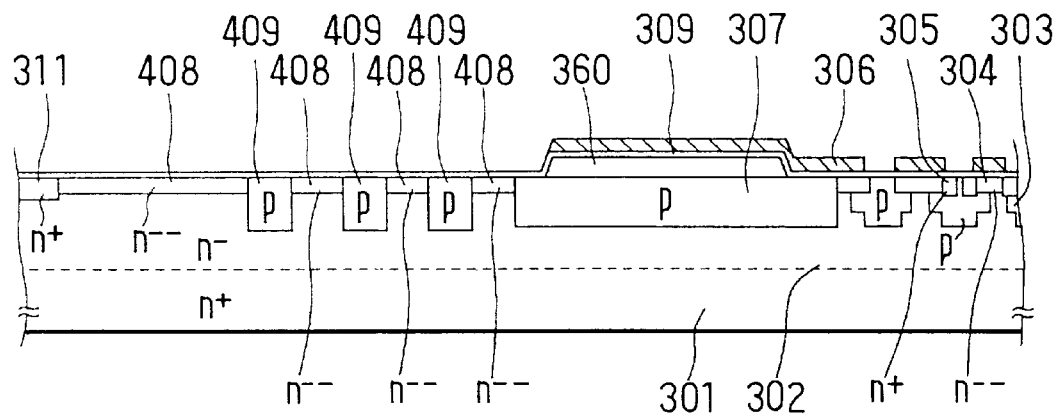
Figure 25B:
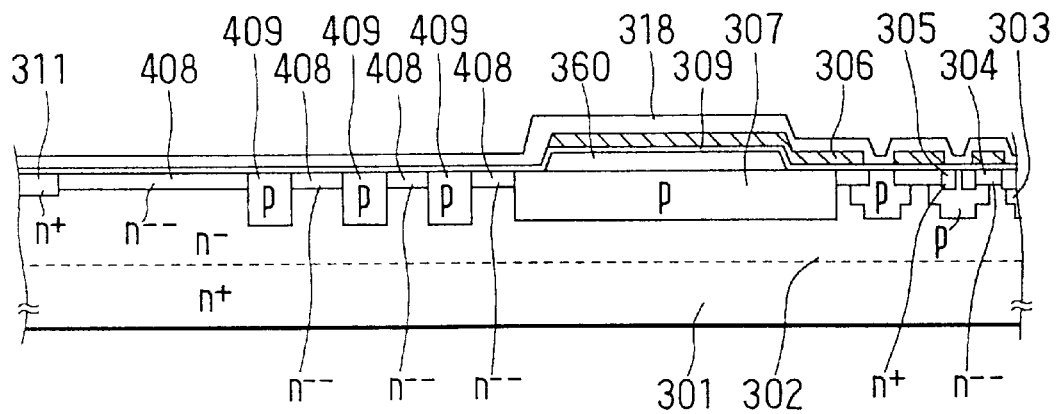

[Step Shown in FIG. 25A]

The thermal oxide film 309 is formed on the entire surface of the wafer by means of thermal oxidation. The thermal oxide film 309 turns to be the gate oxide film. Then, the gate electrode 306 is formed by depositing and patterning polysilicon or the like.

[Step Shown in FIG. 21B]

The interlayer insulating film 318 is formed on the wafer including the gate insulated film. Then, after forming the contact holes in the interlayer insulating film 318 and the thermal oxide film 309, the aluminum wire is patterned and the gate electrode 320, the source electrode 312 and the electrode 410 which forms the field plate are formed. Then, the passivation film 370 is formed on the gate electrode 320, the source electrode 312 and the electrode 410, and the drain electrode 313 is formed on the back of the wafer, thus completing the planar power MOSFET shown in FIG. 22.

(Tenth Embodiment)

Although the trench 5 forming the mesa structure and the trench 7 formed in the cell region are formed in the separate steps in the first embodiment, when a high resistance semiconductor layer which turns to be a channel region is formed on the side face of the trench 7 as shown in Japanese Patent Application Laid-Open No. Hei. 9-74193, the high resistance semiconductor layer may be formed in the same time with the high resistance layer 6. This will be explained by using the drawings.

Figure 26A:
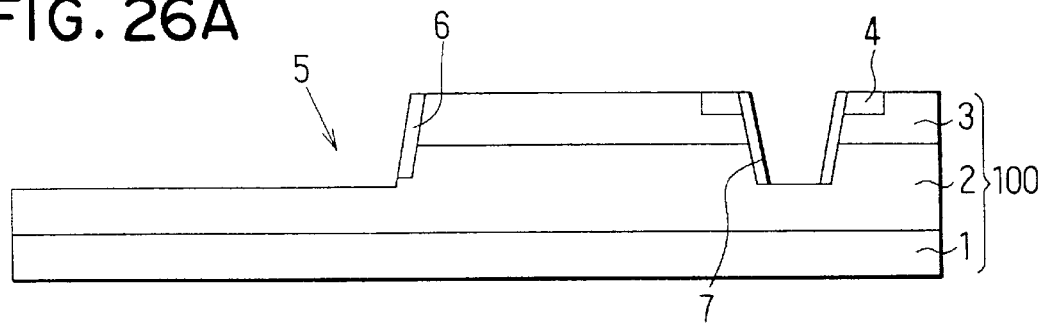
FIGS. 26A and 26B are sectional views showing steps for manufacturing a vertical power MOSFET according to a tenth embodiment of the invention.
Figure 26B:
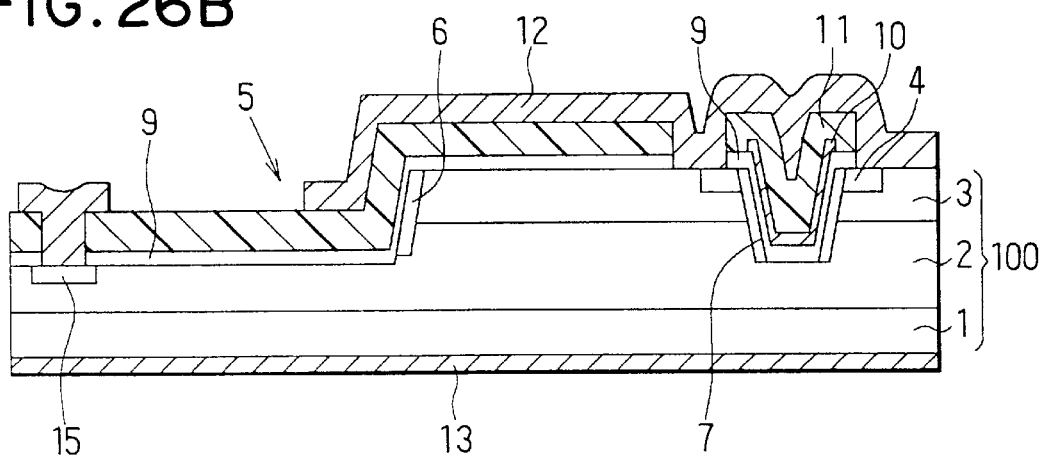

At first, the semiconductor substrate 100 is prepared as shown in FIG. 3A and the trenches 5 and 7 are formed in the same time as shown in FIG. 26A. Then, the high resistance semiconductor layers are formed on the side faces of the trenches 5 and the 7 by the procedure explained by using FIG. 3C. After that, the semiconductor substrate shown in FIG. 26B is completed through the same steps as shown in and after FIG. 4B.

It is noted that the high resistance semiconductor layer which turns to be the channel region may be formed on the side of the trench 7 even when the p-type layer region 201 is formed at the corner of the trench 5 as shown in the sixth embodiment. The high resistance semiconductor layer which turns to be the channel region and the high resistance layer 6 may be formed in the same time also in this case.

Further, the source electrode 12 formed on the n$^+$-type source region 4 and the p-type silicon carbide semiconductor layer 3 and the drain electrode 13 formed on the back of the n$^+$-type silicon carbide semiconductor substrate 1 may be made of metals other than Ni.

Further, although the present invention has been applied to the n-channel vertical power MOSFET in the embodiments described above, the present invention is applicable also to a p-channel vertical power MOSFET. Or, the present invention is applicable to a MOSFET in which no trench 7, whether vertical or horizontal, is formed on the substrate.

Still more, the trenches 5, 7 may be vertical relative to the surface of the substrate or may be a V-shaped trench or an U-shaped trench. The side face of the trench may not be a planar face but may be a smoothly curved face.

Further, although the present invention is applied to the vertical power MOSFET which adopts silicon carbide as a material for forming the substrate in the first through tenth embodiments described above, the present invention is also applicable to a semiconductor device using silicon as a material for forming a substrate.

Still more, although the n$^{--}$-type thin film layers 308, 408 have been formed before forming the p-type regions 307 and 409 in the eighth to tenth embodiments, they may be formed after forming the p-type regions.

(Eleventh Embodiment)

Figure 27:
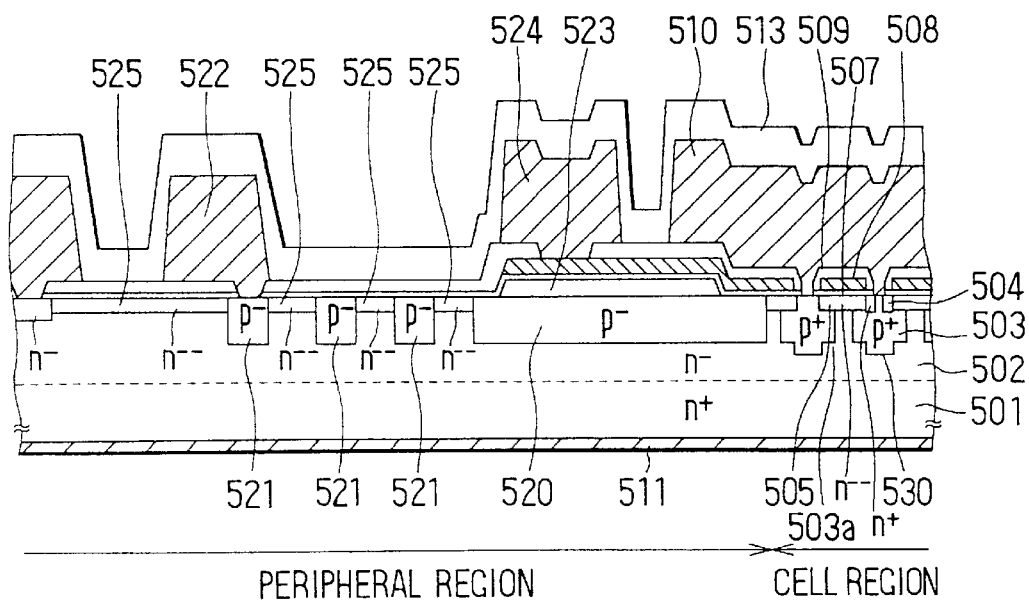
FIG. 27 is a sectional view showing a planar type power MOSFET according to an eleventh embodiment of the invention.

FIG. 27 shows a vertical power MOSFET of the present embodiment. The vertical power MOSFET will be explained below based on this diagram.

The vertical power MOSFET comprises a substrate composed of an n$^+$-type silicon carbide semiconductor substrate 501 and an n$^-$-type silicon carbide semiconductor layer 502 grown thereon. A cell region and a peripheral region surrounding the cell region are formed on the substrate.

A plurality of MOSFETs are formed in the cell region. According to the present embodiment, a planar type power MOSFET is adopted as the MOSFET.

A plurality of p$^+$-type silicon carbide base regions 503 having a predetermined depth are formed separately to one another on the surface layer portion of the n$^-$-type silicon carbide semiconductor layer 502 in the cell region. Among them, a p$^+$-type silicon carbide base region 503a which is located at the outermost periphery of the cell region (hereinafter referred to as a drawing base region 503a) acts as a cell for drawing carriers (positive holes) and those located inside thereof act as a base of a MOSFET.

An n$^+$-type source region 504 which is shallower than the p$^+$ type silicon carbide base region 503 is formed in a predetermined region of the surface layer portion of the p$^+$-type silicon carbide regions 503 which act as a base of the MOSFET. The n$^+$-type source region 504 is not formed on the drawing base region 503a.

Further, a deep base layer 530 which is deepened more than p$^+$-type silicon carbide base region 503 is formed at the position where it does not overlap with the n$^+$-type source region 504 at the center part of the p$^+$-type base region 503. The n$^-$-type silicon carbide semiconductor layer 502 below the deep base layer 530 is thinned by forming the deep base layer 530 so that a distance between the p$^+$-type silicon carbide base region 503 and the n$^+$-type silicon carbide semiconductor substrate 501 is shortened.

Field strength at the n$^-$-type silicon carbide semiconductor layer 502 below the deep base layer 530 is enhanced by forming the deep base layer 530 so that an avalanche breakdown readily occurs thereat. Further, the deep base layer 530 is formed at the above-mentioned position so that serge energy may be pulled out through a path where a parasitic transistor is hardly operated and so that the semiconductor device has an enough inductive load raggedness.

It is noted that the deep base layer 530 is formed to be deeper than a p$^-$-type region 520 for junction use and a p$^-$-type well region 521 which will be described later so that the avalanche breakdown occurs precedently at the deep base layer 530.

Further, an n$^-$-type silicon carbide (SiC) layer 505 is provided on the surface portion of the n$^-$-type silicon carbide semiconductor layer 502 and the p$^+$-type silicon carbide base region 503 between the plurality of the n$^+$-type source regions 504. That is, the n$^-$-type SiC layer 505 is disposed so as to link the n$^+$-type source region 504 and the n$^-$-type silicon carbide semiconductor layer 502 on the surface portion of the p$^+$-type silicon carbide base region 503. The n$^-$-type SiC layer 505 functions as a channel forming layer on the surface of the substrate when the MOSFET is in operation. Hereinafter, the n$^-$-type SiC layer 505 will be referred to as a surface channel layer.

Concentration of dopant of the surface channel layer 505 is as low as $1 \times 10^{15}$ cm$^{-3}$ to $1 \times 10^{17}$ cm$^{-3}$ which is less than that of the n$^-$-type silicon carbide semiconductor layer 502 and the p$^+$-type silicon carbide base region 503. Thereby, ON resistance of the device is lowered.

A gate insulating film (silicon oxide film) 507 is formed on the upper face of the surface channel layer 505 and the upper face of the n$^+$-type source region 504. Further, a gate electrode layer 508 made of poly-silicon is formed on the gate insulating film 507. The gate electrode layer 508 is covered by an insulating film 509 made of LTO (Low Temperature Oxide). A source electrode 510 formed on the insulating film 509 is in contact with the n$^+$-type source region 504 and the p$^+$-type silicon carbide base region 503. Further, a drain electrode 511 is formed on the back of the n$^+$-type silicon carbide semiconductor substrate 501.

Meanwhile, on the outer peripheral region of the semiconductor device, there are a p$^-$-type region 520 for junction use formed so as to surround the cell region on the surface layer portion of the n$^-$-type silicon carbide semiconductor layer 502, a plurality of p$^-$-type well regions 521 formed so as to surround the p$^-$-type region 520 for junction use by a plurality of times on the surface layer portion of the n$^-$-type silicon carbide semiconductor layer 502, and an electrode 522 which is electrically connected with the p$^-$-type well region 521 at the outermost periphery.

The p$^-$-type region 520 for junction use is formed so as to have a predetermined length in the outer peripheral region closest to the cell region and is electrically connected with the source electrode 510 in a section different from the section shown in FIG. 27. A gate electrode 508 is formed on the p$^-$-type region 520 for junction use interposing a thickly-formed insulating film 523 therebetween. The gate electrode layer 508 is connected electrically with a gate electrode 524 via a contact hole formed in an insulating film 509.

The plurality of p$^-$-type well regions 521 form guard rings and are disposed at predetermined intervals from the p$^-$-type region 520 for junction use. An n$^{---}$-type thin film layer (thin film semiconductor layer) 525 whose impurity concentration is lower than that of the n$^-$-type silicon carbide semiconductor layer 502 is provided on the n$^-$-type silicon carbide semiconductor layer 502 between the p$^-$-type well regions 521, between the p$^-$-type well region 521 and the p$^-$-type region 520 for junction use and at the side distant from the cell region from the p$^-$-type well region 521 which is located at the outermost periphery. In detail, the impurity concentration of the n$^{---}$-type thin film layer 525 is $1 \times 10^{16}$ cm$^{-3}$ and the thickness thereof is 0.3 μm. A depletion layer uniformly extends toward the side distant from the cell region without being biased due to the n$^{---}$-type thin film layer 525.

The electrode 522 has a certain width toward the side distant from the cell region while electrically conducting with the p$^-$-type well region 521 located at the outermost periphery. The electrode 522 forms a field plate.

In the vertical power MOSFET constructed as described above, the p$^-$-type region 520 for junction use and the p$^-$-type well regions 521 are formed so as to have the same depth and the same impurity concentration which is lower than that of the p$^+$-type silicon carbide base region 503. In detail, the impurity concentration of the p$^+$-type silicon carbide base region 503 is $1 \times 10^{18}$ cm$^{-3}$ and those of the p$^-$-type region 520 for junction use and the p$^-$-type well region 521 are $1 \times 10^{17}$ cm$^{-3}$ through $3 \times 10^{17}$ cm$^{-3}$. That is, resistances of the p$^-$-type region 520 and the p$^-$-type well region 521 are set to be three times larger than that of p$^+$-type silicon carbide base region 503.

Because the impurity concentration of the p$^-$-type well regions 521 which form the guard rings is low, a predetermined withstand voltage can be maintained even if the interval between the p$^-$-type well regions 521 is widened. In detail, the interval between the p$^-$-type well regions 521 may be as wide as 2 to 3 μm, exceeding 2 μm.

Next, an operation of the vertical power MOSFET constructed as described above will be explained. This MOSFET operates in an normally-off storage mode and the whole region of the surface channel layer 505 is depleted by a difference in electrostatic potential between the p$^+$-type silicon carbide base region 503 and the surface channel layer 505 as well as a potential caused by a difference in work function between the surface channel layer 505 and the gate electrode layer 508. When a voltage is applied to the gate electrode layer 508, a potential difference which is caused by the difference in work function between the surface channel layer 505 and the gate electrode layer 508 and by a sum of voltages applied from the outside changes. As a result, the status of the channel can be controlled.

That is, when the work function of the gate electrode layer 508 is assumed to be a first work function, the work function of the p$^+$-type silicon carbide base region 503 as a second work function and the work function of the surface channel layer 505 as a third work function, the first through third work functions, the impurity concentration of the surface channel layer 505 and the thickness thereof can be set so as to deplete n-type carriers in the surface channel layer 505 by utilizing the difference of the first through third work functions.

Further, in the OFF state, a depleted region is formed within the surface channel layer 505 by an electric field created by the p$^+$-type silicon carbide base region 503 and the gate electrode layer 508. When a positive bias voltage is supplied to the gate electrode layer 508 in this state, a channel region which extends in the direction of the n$^-$-type silicon carbide semiconductor layer 502 (drift region) from the n$^+$-type source region 504 is formed at the interface between the gate insulating film (SiO$_2$) 507 and the surface channel layer 505 and thereby the device is switched to an ON state. At this time, electrons flow from the n$^+$-type source region 504 to the n$^-$-type silicon carbide semiconductor layer 502 via the surface channel layer 505. Then, when the electrons reach the n$^-$-type silicon carbide semiconductor layer 502 (drift region), they flow to the n$^+$-type silicon carbide semiconductor substrate 501 (n$^+$ drain) vertically.

The storage type channel is induced in the surface channel layer 505 and carriers flow between the source electrode 510 and the drain electrode 511 by applying the positive voltage to the gate electrode layer 508 as described above.

Figure 28A:
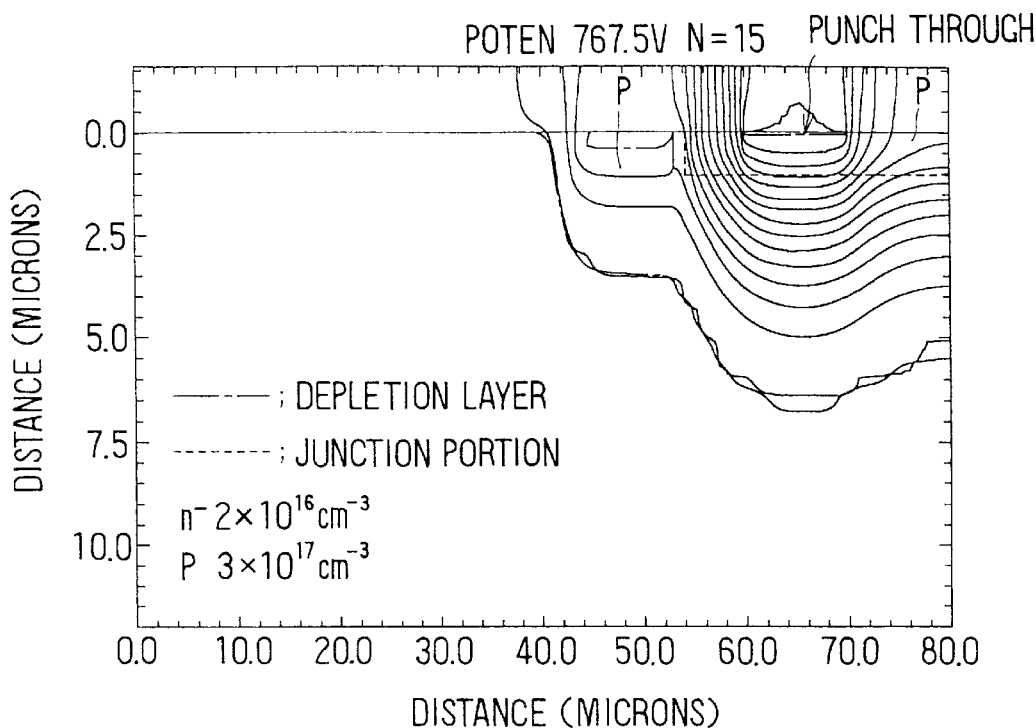
FIGS. 28A and 28B are graphs showing results of calculation of a withstand voltage when impurity concentration of a p-type layer is changed.
Figure 28B:
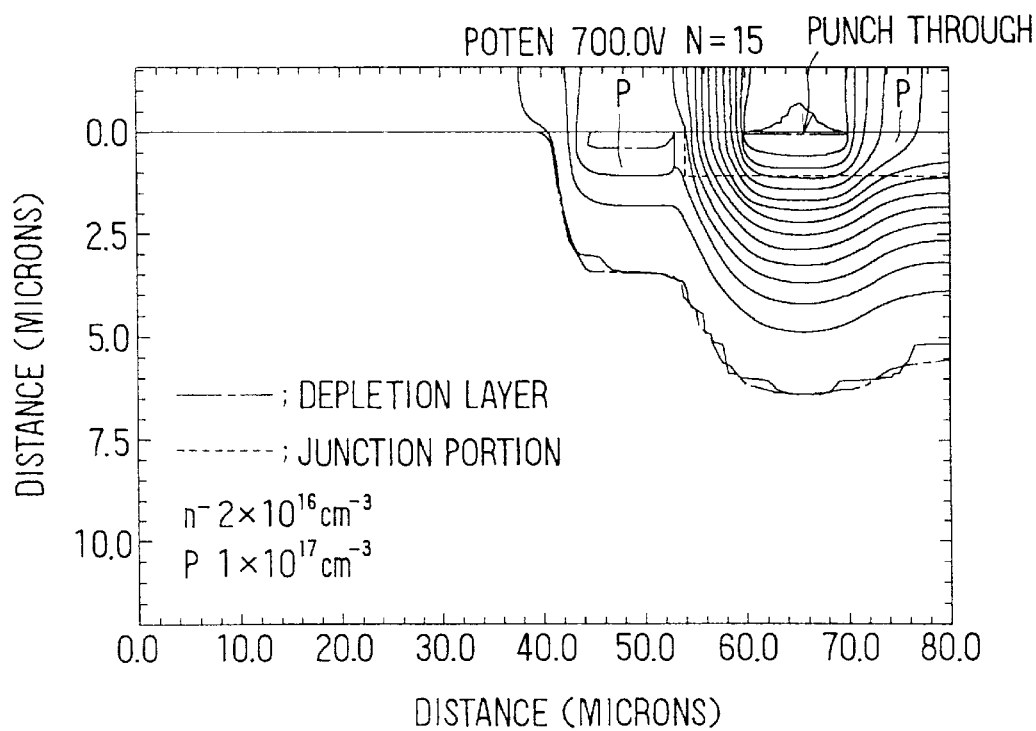

Next, the withstand voltage of the above-mentioned vertical power MOSFET will be explained. FIGS. 28A and 28B are graphs showing measured results of the withstand voltage at the outer peripheral region, i.e. voltages between the drain and the source (VDS) when the depletion layer which has spread within the p$^-$-type region 520 for junction use and the p$^-$-type well region 521 contacts with the insulating films 509, 523 and causes a punch-trough phenomenon. It is noted that FIG. 28A shows a case when the impurity concentrations of the p$^-$-type region 520 for junction use and the p$^-$-type well region 521 are set to $3 \times 10^{17}$ cm$^{-3}$ and FIG. 28B shows a case when the impurity concentrations of the p$^-$-type region 520 for junction use and the p$^-$-type well region 521 are set to $1 \times 10^{17}$ cm$^{-3}$. Equipotential lines in the graphs show the voltages between the drain and the source (VDS) which are divided into 15 levels.

It can be seen that the punch-through phenomenon occurs when 767.5 V is applied between the drain and the source in the case shown in FIG. 28A. Further, it can be seen that the punch-through phenomenon occurs when 700.0 V is applied between the drain and the source in the case shown in FIG. 28B.

Meanwhile, an avalanche breakdown occurred with 660.0 V when the withstand voltage in the cell region was calculated with the assumption of that the impurity concentration of the p$^+$-type silicon carbide base region 503 is $1\times10^{18}$ cm$^{-3}$.

Accordingly, because the withstand voltage of the peripheral region becomes very large as compared to that of the cell region when the impurity concentrations of the p$^-$-type region 520 for junction use and the p$^-$-type well region 521 are set to $3\times10^{17}$ cm$^{-3}$ as shown in FIG. 28A, the avalanche breakdown can be caused reliably in the cell region. However, a difference of the withstand voltages between the cell region and the peripheral region is small when the impurity concentrations of the p$^-$-type region 520 and the p$^-$-type well region 521 are set to $1\times10^{17}$ cm$^{-3}$. Therefore, it is preferable to set the impurity concentration of the p$^-$-type region 520 for junction use and the p$^-$-type well region 521 to around $3\times10^{17}$ cm$^{-3}$ in order to cause the avalanche breakdown reliably in the cell region.

Because the withstand voltage is also related with the depth of the p$^-$-type region 520 for junction use from the surface of the substrate, it is necessary to set values of the depth and the impurity concentration thereof such that they will not cause the punch-through in the outer peripheral portion before the avalanche breakdown occurring in the cell region.

Further, when static electricity is generated in the drain electrode 511 or when the switching operation is made to drive the inductive load, because the p$^-$-type region 520 is formed in low impurity concentration, the positive holes which have been generated below the p$^-$-type region 520 are hardly pulled out through the p$^-$-type region 520. Therefore, the concentration of current might occur at the end of the cell region. As a result, the parasitic transistor is caused to operate, and thereby the breakdown of the device might happen. However, because the drawing base region 503a is formed in the vicinity of the p$^-$-type region 520, the positive holes generated below the p$^-$-type region 520 may be pulled out through the drawing base region 503a and the breakdown of the device can be prevented.

Next, steps for manufacturing the vertical power MOSFET shown in FIG. 27 will be explained based on FIGS. 29A through 29C, FIGS. 30A through 30C and FIGS. 31A through 31C.

Figure 29A:
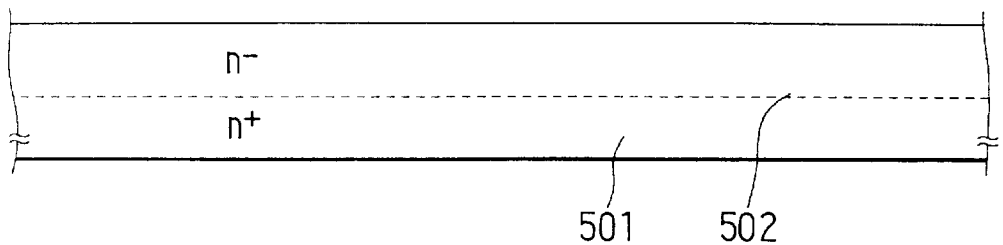
FIGS. 29A to 29C, 30A to 30C and 31A to 31C are sectional views showing steps for manufacturing the planar type power MOSFET shown in FIG. 27.

[Step Shown in FIG. 29A]

The low resistance n$^+$-type silicon carbide semiconductor substrate 501 is prepared and the high resistance n$^-$-type silicon carbide semiconductor layer 502 is epitaxially grown on the n$^+$-type silicon carbide semiconductor substrate 501.

Figure 29B:
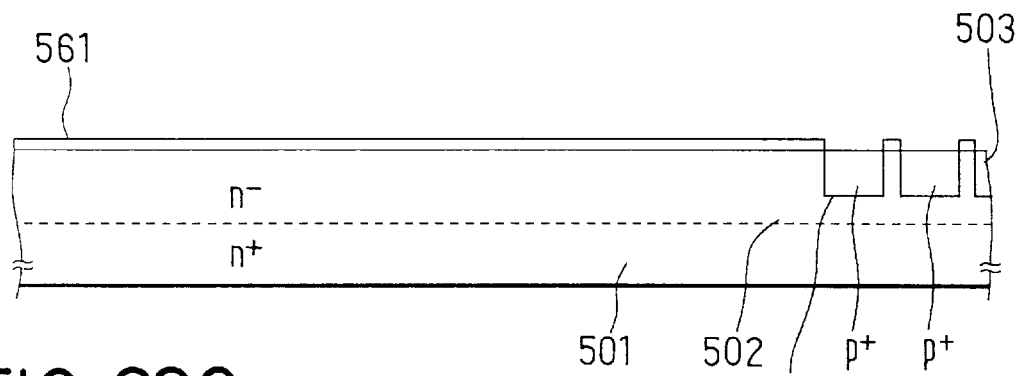

[Step Shown in FIG. 29B]

The p-type silicon carbide base region 503 is formed, by using a mask member 561, in the region where the unit cell is to be formed on the surface layer portion of the n$^-$-type silicon carbide semiconductor layer 502.

Here, it is conceivable to form the p$^+$-type silicon carbide base region 503 simultaneously with the p$^-$-type well region 521 and the p$^-$-type region 520 for junction use which are formed later. However, they are formed separately here because it is required to enhance the concentration of the p$^+$-type silicon carbide base region 503 so that the unit cell is of an normally-off type, i.e. so that the depletion layer extends largely from the p$^+$-type silicon carbide base region 503 to the surface channel layer 505.

Figure 29C:
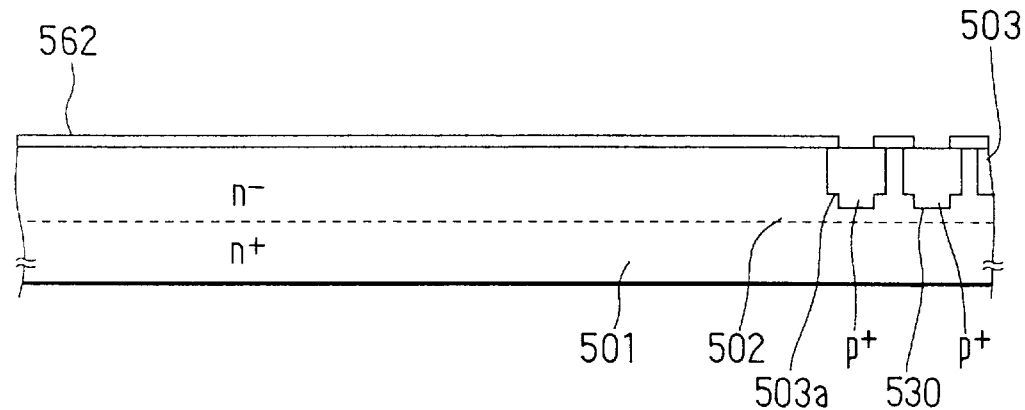

[Step Shown in FIG. 29C]

The deep base layer 530 by which p$^+$-type silicon carbide base region 503 is partly deepened is formed at the center part of the p$^+$-type silicon carbide base region 503 by using a mask member 562. At this time, the junction depth of the deep base layer 530 is arranged to be deeper than the depth of the p$^-$-type well region 521 and the p$^-$-type region 520 which are formed in the latter steps.

Figure 30A:
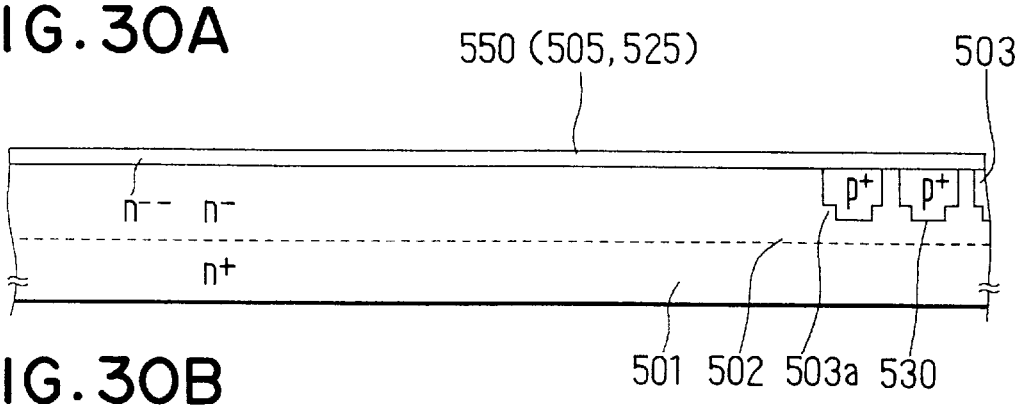

[Step Shown in FIG. 30A]

The n$^{--}$-type thin film layer 550 is formed on the n$^-$-type silicon carbide semiconductor layer 502 including the p$^+$-type silicon carbide base region 503 by means of epitaxial growth. The n$^{--}$-type thin film layer 550 forms the surface channel layer 505 for forming the channel and the n$^{--}$-type thin film layer 525 which plays a role of reducing the field strength at the interface between the insulating film 509 and the n$^{--}$-type thin film layer 525 interposed between the p$^-$-type well regions 521.

Figure 30B:
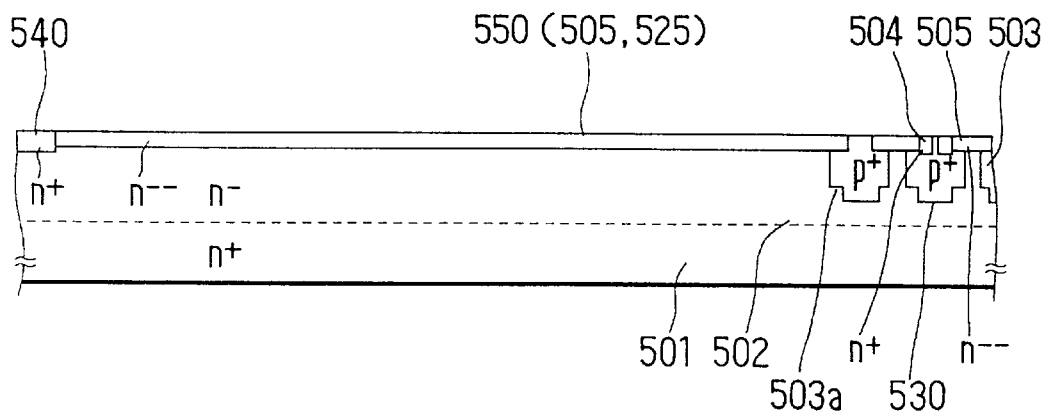

[Step Shown in FIG. 30B]

The n$^+$-type source regions 504 are formed at predetermined regions on the p$^+$-type silicon carbide base region 503, and the n$^+$-type layer 540 for contact use is formed at a predetermined region of the peripheral region by ion-implanting the n-type impurity. Further, the p-type impurity is ion-implanted to invert parts of the n$^{--}$-type thin film layer 550 on the p$^+$-type silicon carbide base region 503 other than the parts where the channel is to be formed (between the n$^+$-type source region 504 in the figure) to p-type. As a result, the parts inverted to the p-type can conduct with the p$^+$-type silicon carbide base region 503 in the cell region.

Figure 30C:
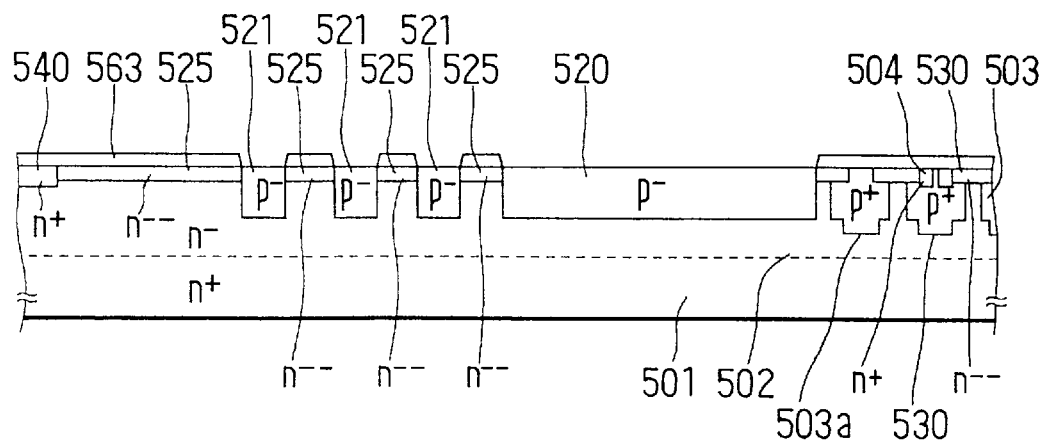

[Step Shown in FIG. 30C]

The p$^-$-type region 520 is formed in the peripheral region, and the plurality of p-type well regions 521 which turn to be the guard rings are formed toward the side distant from the unit cell region from the p$^-$-type region 520 by using the mask member 563. Because the p$^-$-type well region 521 is made so that the impurity concentration thereof is low, the interval between the p$^-$-type well regions 521 may be 2 to 3 μm which is relatively wide. Therefore, the interval of the p$^-$-type well regions 521 can be set in taking a variation of etching amount in opening the mask into consideration.

At this time, an alignment of the mask member is set so that the p$^-$-type region 520 is formed at the position very close to the drawing base region 503a which has been formed in advance, or more specifically, at the position distant from the drawing base region 503a by about 1 μm, from the reason of enhancing the withstand voltage by preventing the concentration of current.

While the p$^-$-type region 520 has been formed between the p$^-$-type well region 521 and the cell region in the present embodiment, its reason will be explained below.

As described above, the p$^-$-type well regions 521 and the p$^+$-type silicon carbide base region 503 are formed by using the different masks. However, when the positions where the p$^-$-type well regions 521 and the p$^+$-type silicon carbide base region 503 are to be formed are dislocated due to dislocation of the masks, the interval therebetween is changed, varying the withstand voltage. Therefore, the p$^-$-type region 520 is formed between the p$^-$-type well region 521 and the p$^+$-type silicon carbide base region 503. Particularly, the p$^-$-type region 520 and the p$^-$-type well regions 521 are formed by the common mask so that the interval between the p$^-$-type region 520 and the p$^-$-type well region 521 is fixed and thereby so that the withstand voltage is fixed.

The p$^-$-type region 520 is formed from the reason described above. However, because the p$^-$-type region 520 is formed simultaneously with the p$^-$-type well regions 521, its concentration is low and the positive holes generated below the p⁻-type region 520 when the inductive load is driven or when electrostatic energy is applied to the drain electrode are hardly pulled out therethrough. However, the drawing base region 503a is provided so that the positive holes can be readily pulled out.

Further, because the p⁻-type well regions 521 and the p⁻-type region 520 are formed by the different mask from that for forming the p⁺-type silicon carbide base region 503, the p⁻-type region 520 and the p⁺-type silicon carbide base region 503 may be formed so that they approach to each other due to the dislocation of the masks (misalignment). When the dislocation of the masks is large, the p⁻-type region 520 may be formed overlapping with the drawing base region 503a.

If the p⁻-type region 520 is not provided and the p⁻-type well region 521 is formed overlapping with the drawing base region 503a for example, the potential of the p⁻-type well region 521 is equalized with that of the drawing base region 503a. Then, the p⁻-type well regions 521 cannot play the role of the guard rings because the potential thereof is not in the floating condition.

However, because there is provided the p⁻-type region 520, the p⁻-type region 520 which contacts with the source electrode 510 just overlaps with the drawing base region 503a even though the dislocation of the masks increases and the p⁻-type region 520 overlaps with the drawing base region 503a, causing no particular problem and avoiding the trouble caused by the dislocation of the masks.

It is noted that, although the impurity concentration increases at the p⁻-type region 520 when the p⁻-type region 520 overlaps with the drawing base region 503a, it will not affect the variation of the withstand voltage so much because the concentration of the p⁻-type region 520 is low.

Figure 31A:
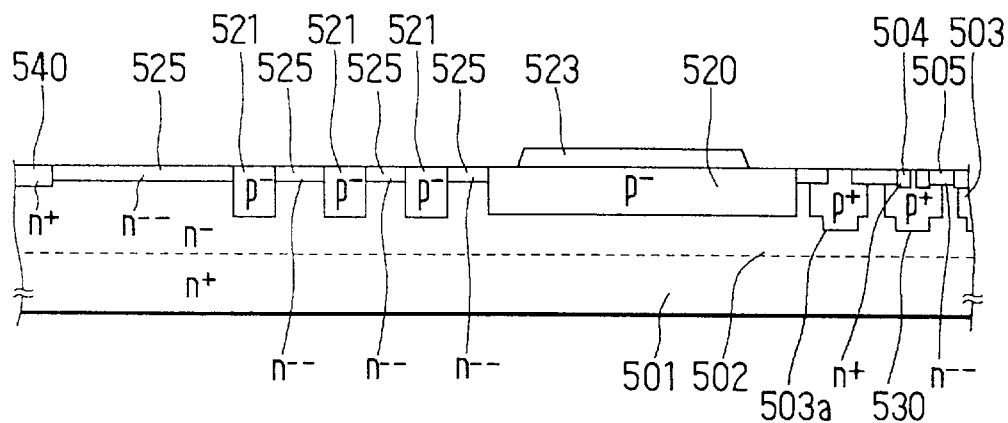

[Step Shown in FIG. 31A]

The oxide film (SiO₂) 523 having a predetermined thickness is formed on the p⁻-type region 520 through a photolithographic process.

Figure 31B:
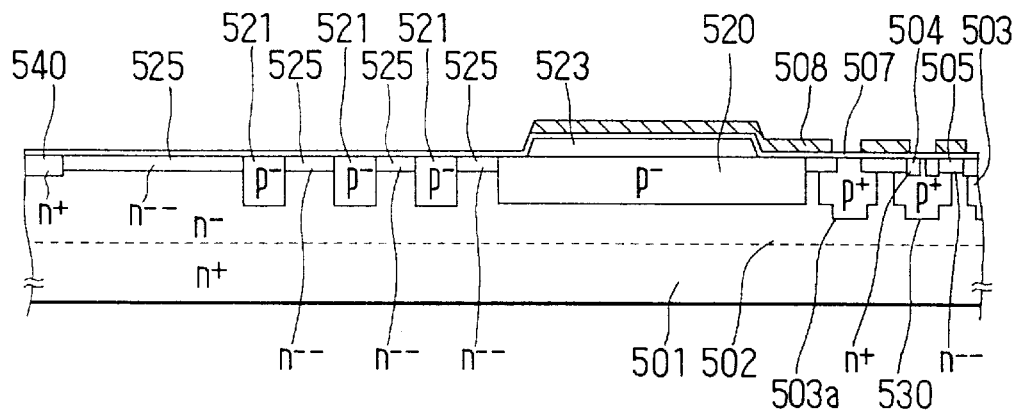

[Step Shown in FIG. 31B]

The thermal oxide film 507 is formed on the whole surface of the wafer by means of thermal oxidation. The gate insulating film 507 forms the gate oxide film. Then, the gate electrode layer 508 is formed on the gate insulating film 507 by depositing poly-silicon and the like and by patterning it.

Figure 31C:
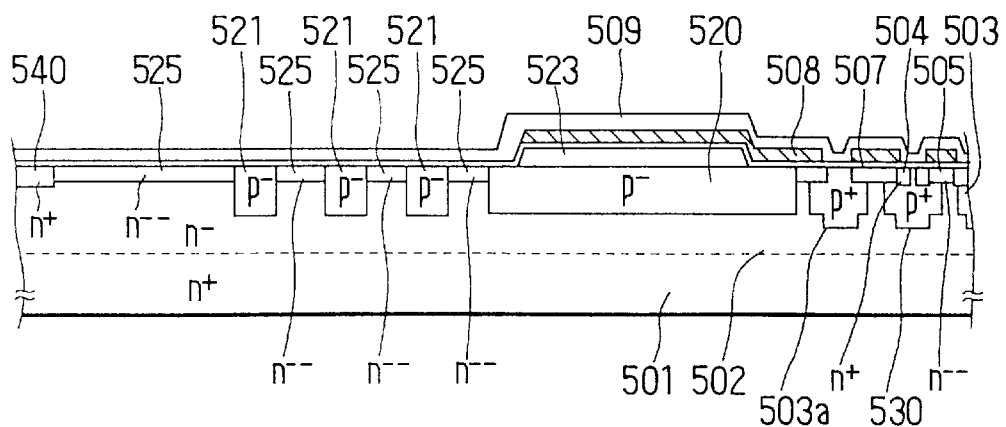

[Step Shown in FIG. 31C]

The insulating film 509 is formed on the wafer including the gate insulating film 507.

Then, after creating a contact hole in the thermal oxide film 507 and the insulating film 509, an aluminum wire is patterned, the gate electrode 524, the source electrode 510 and the electrode 522 which forms the field plate are formed. Then, the passivation film 513 is formed on the gate electrode 524, the source electrode 510 and the electrode 522, and the drain electrode 511 is formed on the back of the n⁺-type silicon carbide semiconductor substrate 501, thus completing the vertical power MOSFET shown in FIG. 27.

Although the p⁻-type region 520 and the drawing base region 503a have been formed in the eleventh embodiment, they may be eliminated. However, it is preferable to provide them by the reason described above.

Further, while one similar to the n⁺-type source region 504 formed on the p⁺-type silicon carbide base region 503 has not been formed on the drawing base region 503a in the embodiment described above, it is possible to arrange such that one similar to the n⁺-type source region 504 is not formed at least on the outside of the cell region from the deep base layer 530 in the drawing base region 503a.

It is because, while it is arranged such that the positive holes generated below the p⁻-type region 520 when static electricity is generated in the drain electrode 511 or when the inductive load is driven are pulled out by the drawing base region 503a, the parasitic transistor may be formed and be activated when one similar to the n⁺-type source region 504 is formed on the outside of the cell region from the drawing base region 503a or the deep base layer 530 in particular.

(Twelfth Embodiment)

Figure 32:
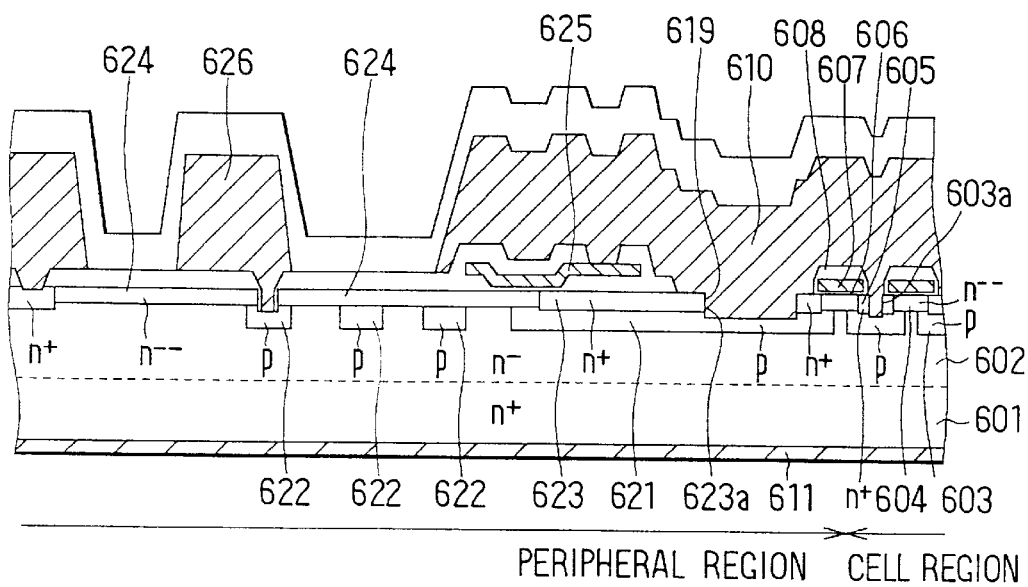
FIG. 32 is a sectional view of a silicon carbide semiconductor device provided with a guard ring structure according to a twelfth embodiment of the invention.

FIG. 32 is a section view of a silicon carbide semiconductor device according to a twelfth embodiment of the present invention. The structure of the silicon carbide semiconductor device of the present embodiment will be explained below with reference to FIG. 32.

As shown in FIG. 32, the semiconductor device comprises a cell region and a peripheral region formed to surround the periphery of the cell region.

A planar type power MOSFET is constructed in the cell region. The planar type power MOSFET has a substrate composed of an n⁺-type silicon carbide semiconductor substrate 601 and an n⁻-type epitaxial layer 602 and comprises a plurality of p-type base regions 603 and a surface channel layer 604 parallel to the surface of the substrate. The surface channel layer 604 has an impurity concentration of $1\times10^{16}$ cm⁻³ and a thickness of 0.3 μm.

An n⁺-type source region 605 is formed at the center part of the p-type base region 603 so as to contact with the surface channel layer 604. Then, a gate electrode 607 is formed on the surface channel layer 604 interposing a gate insulating film 606 therebetween. The gate electrode 607 is covered by an insulating film 608.

A source electrode 610 is formed on the insulating film 608 and is electrically connected with the p-type base region 603 via a through hole formed in the n⁺-type source region 605. A drain electrode 611 is formed on the back of the n⁺-type silicon carbide semiconductor substrate 601.

In this way, a plurality of planar type power MOSFETs in each of which a storage type channel is formed, are formed in the cell region. This planar type power MOSFET is of an normally-off type. That is, the thickness of the surface channel layer 604 is smaller than a sum of an extension of a depletion layer extending from the p-type base region 603 to the surface channel layer 604 when no voltage is applied to the gate insulating film 606 and an extension of a depletion layer extending from the gate insulating film 606 to the surface channel layer 604.

In detail, the extension of the depletion layer extending from the p-type base region 603 to the surface channel layer 604 is determined by a built-in voltage of a PN junction between the surface channel layer 604 and the p-type base region 603. The extension of the depletion layer extending from the gate insulating film 606 to the surface channel layer 604 is determined by electric charge of the gate insulating film 606 and a difference in work function between the gate electrode 607 (metal) and the surface channel layer 604 (semiconductor). The thickness of the surface channel layer 604 is set based on the extensions of the depletion layers.

Such a normally-off type planar type power MOSFET allows to assure the safety as compared to the normally-on type because it allows to prevent a current from flowing even when no voltage can be applied to the gate electrode 607 due to a failure and the like.

In the planar type power MOSFET constructed as described above, a drain current flows between the source electrode 610 and the drain electrode 611 by using the surface channel layer 604 as a channel region when a positive voltage is applied to the gate electrode 607 since the extension of the depletion layer extending from the gate insulating film 606 to the surface channel layer 604 contracts.

It is noted that, as shown in FIG. 32, the p-type base region 603 contacts with the source electrode 610 and is brought into the grounded state. Therefore, the surface channel layer 604 may be pinched off by utilizing the built-in voltage of the PN junction between the surface channel layer 604 and the p-type base region 603. For instance, because the depletion layer cannot be extended from the p-type base region 603 by utilizing the built-in voltage when the p-type base region 603 is not grounded and is in a floating state, it is effective to contact the p-type base region 603 with the source electrode 610 in order to pinch off the surface channel layer 604. It is noted that the p-type base region 603 may be utilized more effectively by enhancing the concentration of the p-type base region 603.

Meanwhile, a p-type region 621 as a device separating layer for preventing a breakdown and a plurality of p-type regions 622 having a predetermined width and constituting guard rings are provided in the peripheral region of the cell region so as to surround the cell region. The p-type region 621 and the p-type regions 622 are formed on the surface layer portion of the n$^-$-type epitaxial layer 602. The p-type regions 622 are disposed at predetermined intervals toward the side distant from the cell region from the p-type region 621.

An n$^+$-type region 623 made in high concentration equally with the n$^+$-type source region 605 is formed on the p-type region 621. The n$^+$-type region 623 is formed so as to terminate above the p-type region 621. A through hole 623a for contact use is formed in the n$^+$-type region 623, and the source electrode 610 is electrically connected with the p-type region 621 via the through hole 623a. The source electrode 610 also contacts with the n$^+$-type region 623.

An n$^{---}$-type thin film semiconductor layer 624 is formed on the p-type region 621 and the p-type regions 622 on the side distant from the cell region rather than the n$^+$-type region 623. The n$^{---}$-type thin film semiconductor layer 624 is arranged such that a width thereof in the circumferential direction centering on the cell region at the part located on the p-type region 621 is greater than a width of the surface channel layer 604 formed on the p-type base region 603 in the cell region.

The n$^{---}$-type thin film semiconductor layer 624 is formed simultaneously with the surface channel layer 604 and has an impurity concentration of $1 \times 10^{16}$ cm$^{-3}$ and a thickness of 0.3 μm.

An electrode layer 625 which is electrically connected with the source electrode 610 via a contact hole formed in the insulating film 608, is formed on the n$^{---}$-type thin film semiconductor layer 624 positioned at least on the p-type region 621. It is noted that the electrode layer 625 approaches most to the n++-type thin film semiconductor layer 624 on the n$^{++}$-type thin film semiconductor layer 624 positioned on the p-type region 621 and is distant from the n$^{++}$-type thin film semiconductor layer 624 as it is away from the cell region, thus playing the role of the field plate.

The p-type region 622 located at the position distant most from the cell region is electrically connected with an electrode 626 which forms the field plate via a contact hole formed in the n$^{---}$-type thin film semiconductor layer 624.

When a high voltage is applied to the drain electrode 611 of the planar type power MOSFET thus constructed, the extension of the depletion layer in the transverse direction of the device may be increased because the n$^{---}$-type thin film semiconductor layer 624 is formed in the concentration lower than that of the n$^-$-type epitaxial layer 602.

The dielectric breakdown of the insulating films 606, 608 can be prevented and the withstand voltage of the silicon carbide semiconductor device can be enhanced by reducing the field strength at the interface between the insulating film composed of the gate insulating film 606 and the insulating film 608 and the substrate surface.

Here, the electrode layer 625 electrically connected with the source electrode 610 via the insulating film 608 is formed on the n$^{---}$-type thin film semiconductor layer 624 positioned at least on the p-type region 621 in the present embodiment as described above. Therefore, the n$^{---}$-type thin film semiconductor layer 624 is pinched off by the depletion layer extending from the gate insulating film 606 and the depletion layer extending from the p-type region 621, similarly to the surface channel layer 604. Accordingly, the drain current flowing through the n$^+$-type silicon carbide semiconductor substrate 601 and the n$^-$-type epitaxial layer 602 as well as the n$^{---}$-type thin film semiconductor layer 624 may be suppressed. Thereby, even if the part where the n$^{---}$type thin film semiconductor layer 624 contacts with the source electrode 610 is a schottky contact (actually they contact via the n$^+$-type region 623), the voltage applied to the contact is fully low as compared to the drain voltage because the drain voltage is applied to and absorbed by the pinch-off section. Accordingly, it is possible to prevent the withstand voltage at that contact from dropping.

Further, because the semiconductor device is arranged such that the width of the n$^{---}$-type thin film semiconductor layer 624 on the p-type region 621 is larger than the width of the surface channel layer 604 formed on the p-type base region 603, the withstand voltage at the n$^{---}$-type thin film semiconductor layer 624 can be higher than that of the cell region.

Still more, because it is arranged such that not the n$^{---}$-type thin film semiconductor layer 624, but the n$^+$-type region 623 formed in high concentration contacts with the source electrode 610, the contact therebetween turns to be an ohmic contact, thus enhancing the withstand voltage at the part contacting with the source electrode 610.

Also, because the n$^+$-type region 623 and the n$^+$-type source region 605 are formed in the equal impurity concentration, the withstand voltage of the contact section between the n$^+$-type region 623 and the source electrode 610 may be equalized with the withstand voltage of the contact section between the n$^+$-type source region 605 and the source electrode 610, thus facilitating the design of the withstand voltage.

Next, steps for manufacturing the silicon carbide semiconductor device shown in FIG. 32 will be explained based on FIGS. 33A through 33C, FIGS. 34A, 34B and FIGS. 35A through 35C.

Figure 33A:
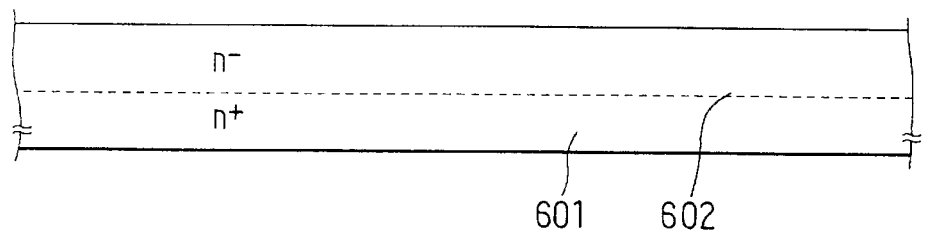

[Step Shown in FIG. 33A]

The low resistance n$^+$-type silicon carbide semiconductor substrate 601 is prepared and the high resistance n$^-$-type silicon carbide semiconductor layer 602 is epitaxially grown on the n$^+$-type silicon carbide semiconductor substrate 601.

Figure 33B:
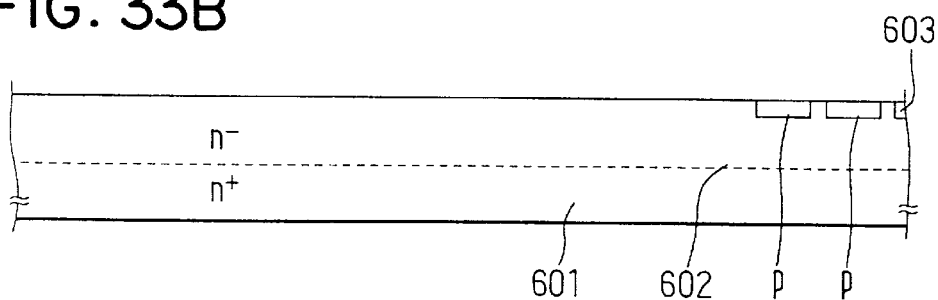

[Step Shown in FIG. 33B]

The plurality of p-type base regions 603 having a high concentration are formed on the region where the unit cell is to be formed in the surface layer portion of the n$^-$-type silicon carbide semiconductor layer 602.

Figure 33C:
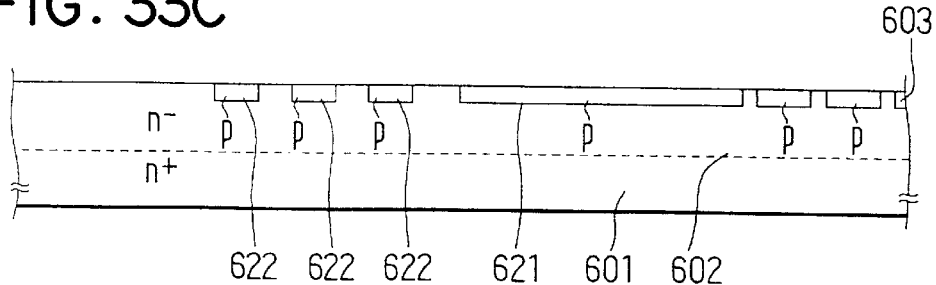

[Step Shown in FIG. 33C]

Next, a p-type impurity is ion-implanted to form the p-type region 621 for preventing the breakdown and to form the p-type regions 622 which turn to be the guard rings toward the side distant from the unit cell region rather than the p-type region 621.

It is noted that because the p-type base region 603 is formed in the high concentration to utilize the built-in voltage effectively in the present embodiment, the p-type base region 603 and both the p-type region 621 and the p-type region 622 are formed in the different steps. However, they may be formed in the same step when the p-type base region 603 is not formed in the high concentration. Thereby, because the p-type base region 603, the p-type region 621 and the p-type region 622 may be formed by using one mask, they may be formed in an accurate positional relationship.

[Step Shown in FIG. 34A]

An $n^{--}$-type thin film layer 630 is formed on the $n^-$-type silicon carbide semiconductor layer 602 including the p-type base region 603 by means of epitaxial growth. The $n^{--}$-type thin film layer 630 forms the surface channel layer 604 for forming a channel and the $n^{--}$-type thin film semiconductor layer 624 which plays the role of reducing the field strength at the interface of a thermal oxide film 609.

[Step Shown in FIG. 34B]

The n-type impurity is ion-implanted to form the $n^+$-type source region 605 in the predetermined region on the p-type base region 603 and the $n^+$-type region 623 which terminates within the p-type region 621. Thereby, the $n^+$-type source region 605 and the $n^+$-type region 623 are formed in the equal impurity concentration.

At this time, an $n^+$-type layer 627 for contacting with the part which acts as the equipotential ring (EQR) is also formed in the predetermined region of the peripheral region.

Figure 35A:
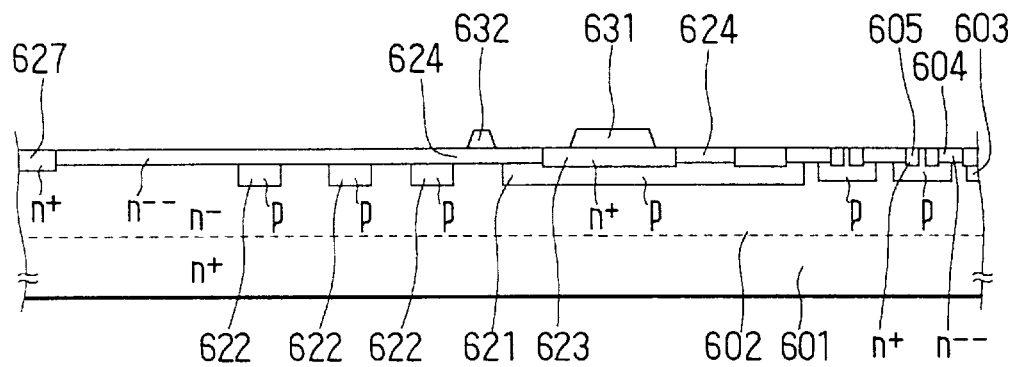

[Step Shown in FIG. 35A]

An oxide film (SiO$_2$) 631 having a predetermined thickness is formed on the p-type region 621, and an oxide film 632 is formed at the part positioned at the periphery of the cell region rather than the p-type region 621 through a photolithography step.

Figure 35B:
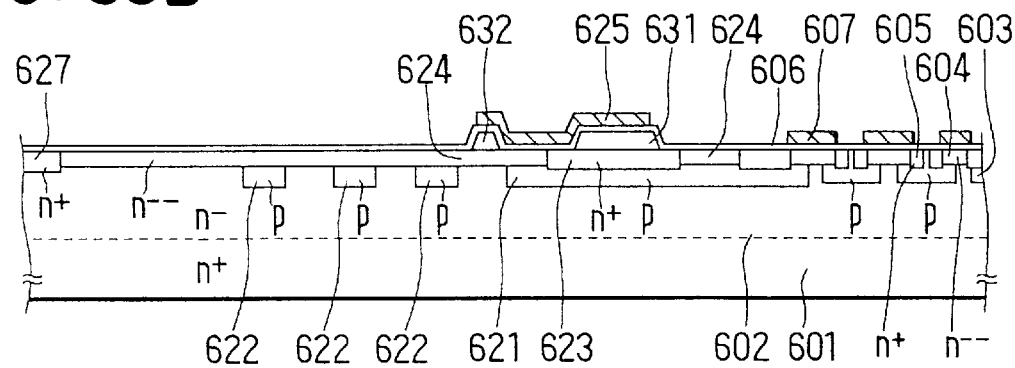

[Step Shown in FIG. 35B]

The gate insulating film 606 is formed on the whole surface of the wafer by means of thermal oxidation. Then, the gate electrode 607 in the cell region and the electrode layer 625 on the $n^{--}$-type thin film semiconductor layer 624 formed on the p-type region are formed by depositing polysilicon and by patterning it.

Figure 35C:
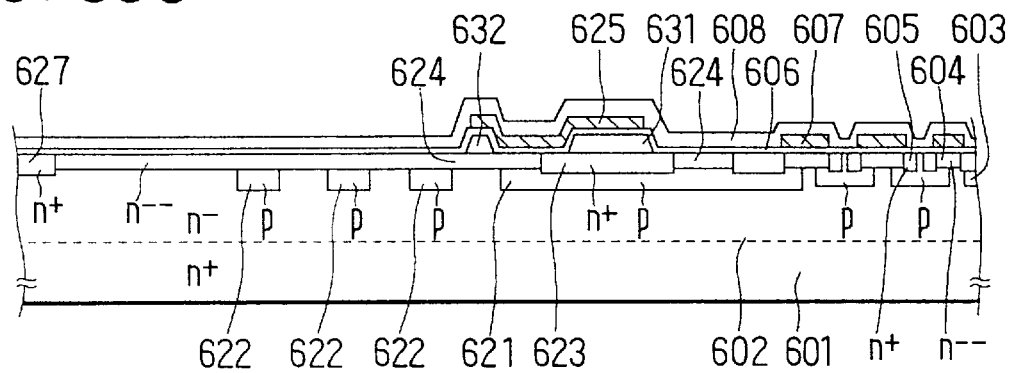
Figure 37:
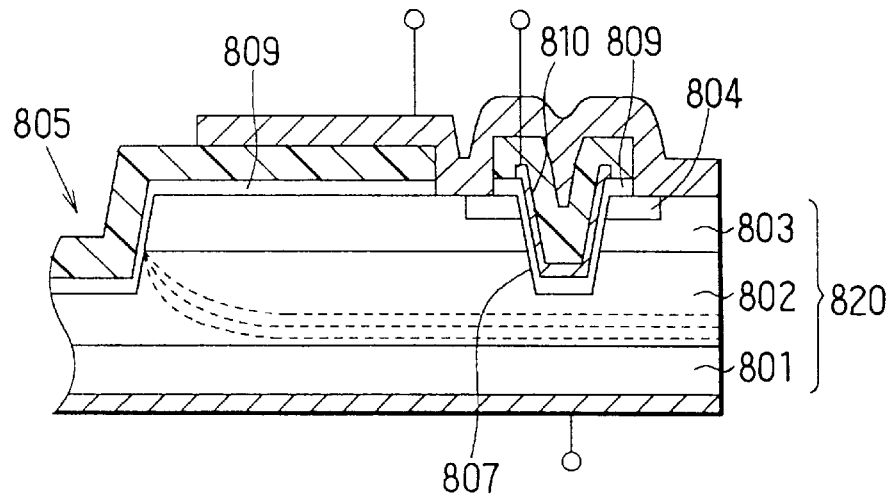
FIG. 37 is a sectional view showing a distribution of an electric field in a conventional vertical type power MOSFET having a mesa structure.

[Step Shown in FIG. 35C]

The interlayer insulating film 608 is formed on the wafer including the gate insulating film.

After that, a contact hole is formed in the insulating film 608 and the gate insulating film 606. Further, a through hole 603$a$ which penetrates through the $n^{--}$-type thin film semiconductor layer 624 and reaches the p-type base region 603, a through hole 623$a$ which penetrates through the $n^{--}$-type thin film semiconductor layer 624 and the $n^+$-type region 623 and reaches the p-type region 621, and a through hole which penetrates through the $n^{--}$-type thin film semiconductor layer 624 and reaches the p-type region 622 positioned at the outermost periphery.

Then, an aluminum wire is patterned and the source electrode 610 and the electrode 626 constituting the field plate are formed. Then, a passivation film 613 is formed on the source electrode 610 and the electrode 626, and the drain electrode 611 is formed on the back of the $n^+$-type silicon carbide semiconductor substrate 601, thus completing the planar power MOSFET shown in FIG. 32.

Although the method of creating the through holes has been shown to form the electrodes which contact with the p-type regions 603, 621 and 622 in the embodiment described above, the conductivity type of the $n^{--}$-type thin film semiconductor layer 624 on those p-type regions 603, 621 and 622 may be inverted by means of ion-implantation. In this case, a step of ion-implanting the p-type impurity just needs to be provided after the step shown in FIG. 34B.

Further, although the electrode layer 625 electrically contacts with the source electrode 610 in the embodiment described above, it may be arranged so that it contacts with the gate electrode 607, not the source electrode 610. When the electrode layer 625 is arranged so as to contact with the gate electrode 607 as described above, the drain current may be caused to flow by using the $n^{--}$-type thin film semiconductor layer 624 on the p-type region 621 as a channel.

It is noted that, in such a case, it is more effective to form the $n^+$-type region 623 and the $n^+$-type source region 605 at the same time so as to facilitate the design of the withstand voltage.

Although the guard ring structure having the p-type regions 622 as the guard ring layers and the electrode 626 as the field plate has been described in the above-mentioned embodiment, they may be eliminated. In such a case, the field plate structure is composed of only the electrode 625 which contacts with the source electrode 610 or the gate electrode 607.

Further, although the normally-off type planar power MOSFET has been exemplified in the above-mentioned embodiment, an normally-on type planar power MOSFET may be also used because ON/OFF of the current flowing through the $n^{--}$-type thin film semiconductor layer 624 on the p-type region may be switched in the same time with ON/OFF of the cell region by contacting the gate electrode 607 electrically with the electrode layer 625.

What is claimed is:

1. A semiconductor device comprising:

a semiconductor substrate which is composed of a first conductivity type low resistance layer, a first conductivity type first semiconductor layer which is formed on the low resistance layer and whose resistance is higher than that of the low resistance layer, and a second conductivity type second semiconductor layer formed on the first semiconductor layer, a surface of the second semiconductor layer being a main surface of the semiconductor substrate;

a first conductivity type semiconductor region formed in the second semiconductor layer so that an end thereof terminates at the main surface;

a first trench which penetrate through the semiconductor region and the second semiconductor layer;

a second trench which penetrates through the second semiconductor layer;

a field relaxing layer formed on a side face of the second trench;

an insulating film formed on the main surface including a surface of the field relaxing layer and an inside of the first trench;

a gate electrode formed on the insulating film within the first trench;

a first electrode electrically contacting with the semiconductor region; and a second electrode electrically contacting with a back face of the semiconductor substrate, wherein the field relaxing layer relaxes concentration of an electric field in the insulating film.

2. A semiconductor device according to claim 1, wherein the field relaxing layer is formed from the side face of the second trench to a bottom face thereof.

3. A semiconductor device according to claim 1, wherein the field relaxing layer is formed by a material of a first conductivity type and its resistance is higher than that of the first semiconductor layer.

4. A semiconductor device according to claim 3 further comprising:
   an electrode layer formed on a surface of the insulating film formed on a surface of the field relaxing layer, for controlling a potential of the field relaxing layer,
   wherein the electrode layer controls a voltage of the field relaxing layer to be lower than a predetermined threshold voltage.

5. A semiconductor device according to claim 1, wherein the field relaxing layer is formed by a material of a second conductivity type.

6. A semiconductor device according to claim 1, further comprising:
   a third trench which penetrates through the second semiconductor layer from the main surface of the semiconductor substrate between the first and second trenches,
   wherein the third trench electrically divides the second semiconductor layer.

7. A semiconductor device according to claim 1, wherein the low resistance layer, the first semiconductor layer, the second semiconductor layer and the field relaxing layer are formed by silicon carbide.

8. A semiconductor device according to claim 1, wherein the low resistance layer, the first semiconductor layer and the second semiconductor layer are formed by silicon carbide, and the field relaxing layer is formed by an aluminum alloy.

9. A semiconductor device comprising:
   a semiconductor substrate which is composed of a first conductivity type low resistance layer, a first conductivity type first semiconductor layer which is formed on the low resistance layer and whose resistance is higher than that of the low resistance layer, and a second conductivity type second semiconductor layer formed on the first semiconductor layer, a surface of the second semiconductor layer being a main surface of the semiconductor substrate;
   a first conductivity type first semiconductor region formed in the second semiconductor layer so that an end thereof terminates at the main surface;
   a first trench which penetrate through the semiconductor region and the second semiconductor layer;
   a second trench which penetrates through the second semiconductor layer and reaches the first semiconductor layer;
   an insulating film formed at least on inner surfaces of the first and second trenches;
   a gate electrode formed on the insulating film within the first trench;
   a second conductivity type second semiconductor region formed in the first semiconductor layer which constitutes a bottom face of the second trench;
   a first electrode electrically contacting with the first and second semiconductor regions; and
   a second electrode electrically contacting with a back face of the semiconductor substrate.

10. A semiconductor device comprising:
    a first conductivity type substrate;
    a first conductivity type first semiconductor layer which is formed on the substrate and whose resistance is higher than that of the substrate;
    a second conductivity type second semiconductor layer formed on the first semiconductor layer;
    a trench which penetrates through the second semiconductor layer and reaches the first semiconductor layer;
    a first conductivity type semiconductor region formed in the second semiconductor layer so that an end thereof terminates at a surface of the second semiconductor layer;
    an insulating film formed on the trench and a channel region which is defined in the second semiconductor layer between the first semiconductor layer and the semiconductor region;
    a gate electrode formed on the channel region interposing the insulating film therebetween;
    a first electrode electrically contacting with the semiconductor region;
    a second electrode electrically contacting with a back face of the substrate; and
    a field relaxing layer formed between the insulating film and the first semiconductor layer and between the insulating film and the second semiconductor layer at a side face of the trench, for relaxing concentration of an electric field in the insulating film.

11. A semiconductor device comprising:
    a semiconductor substrate which is composed of a first conductivity type low resistance layer, a first conductivity type first semiconductor layer which is formed on the low resistance layer and whose resistance is higher than that of the low resistance layer, and a second conductivity type second semiconductor layer formed on the first semiconductor layer, a surface of the second semiconductor layer being a main surface of the semiconductor substrate;
    a first electrode layer formed at least on the second semiconductor layer interposing an insulating film therebetween in the main surface of the semiconductor substrate;
    a second electrode layer formed on a back face side of the semiconductor substrate,
    a trench which penetrates through the second semiconductor layer and reaches the first semiconductor layer;
    a second conductivity type semiconductor region formed on a surface layer portion of the first semiconductor layer at a corner of the trench.

12. A semiconductor device comprising:
    a semiconductor substrate which is composed of a first conductivity type low resistance layer, a first conductivity type first semiconductor layer which is formed on the low resistance layer and whose resistance is higher than that of the low resistance layer, and a second conductivity type second semiconductor layer formed on the first semiconductor layer, a surface of the second semiconductor layer being a main surface of the semiconductor substrate;
    a first conductivity type first semiconductor region formed in a predetermined region of the second semiconductor layer so that an end thereof terminates at the main surface;
    a first trench which penetrate through the first semiconductor region and the second semiconductor layer;
    a second trench formed to be apart from and surround the first trench, the second trench penetrating through the second semiconductor layer from the main surface;
    a second conductivity type second semiconductor region formed on a surface layer portion of the first semiconductor layer at a corner of the second trench;

an insulating film formed on the main surface including the first and second trenches;

a gate electrode formed on the insulating film inside the first trench;

a first electrode electrically contacting with the first semiconductor region; and a second electrode formed on a back face side of the semiconductor substrate.

13. A semiconductor device according to claim 12, further comprising;

a field relaxing layer made of a first conductivity type semiconductor material and formed on surfaces of the first and second semiconductor layers at a side face of the second trench.

14. A semiconductor device according to claim 12, wherein said second semiconductor region is formed so as to cover a part where the side face of the second trench is connected with a bottom face thereof.

15. A semiconductor device comprising:

a first conductivity type low resistance layer;

a first conductivity type first semiconductor layer whose resistance is higher than that of the low resistance layer and which is formed on the low resistance layer;

a unit cell formed in a predetermined region of the first semiconductor layer;

a second conductivity type device separating layer formed in a periphery of a cell region in which the unit cell is formed and extended, on a surface layer portion of the first semiconductor layer, to a side distant from the cell region;

a field plate disposed on the device separating layer interposing an insulating film therebetween and formed to project to a side distant from the cell region rather than the device separating layer;

a first electrode which electrically contacts with both the unit cell and the device separating layer;

a second electrode which electrically contacts on a back face side of the low resistance layer; and a first conductivity type semiconductor thin film layer whose resistance is higher than that of the first semiconductor layer, which is formed between the insulating film disposed below the field plate and the first semiconductor layer.

16. A semiconductor device according to claim 15, wherein the semiconductor thin film layer is formed to be larger than a depletion layer which extends in the semiconductor thin film layer along an interface between the insulating film and the semiconductor thin film layer toward the side distant from the cell region from the device separating layer when a predetermined reverse bias voltage is applied between the first and second electrodes.

17. A semiconductor device according to claim 15, wherein the semiconductor thin film layer is formed by growing an epitaxial film on the first semiconductor layer.

18. A semiconductor device comprising:

a first conductivity type low resistance layer;

a first conductivity type first semiconductor layer whose resistance is higher than that of the low resistance layer and which is formed on the low resistance layer;

a unit cell formed in a predetermined region of the first semiconductor layer, the unit cell including a second conductivity type base layer;

a second conductivity type device separating layer formed in a periphery of a cell region in which the unit cell is formed and extended, on a surface layer portion of the first semiconductor layer, to a side distant from the cell region;

a plurality of second conductivity type second semiconductor layers having a predetermined width disposed, on a surface layer portion of the first semiconductor layer, at predetermined intervals from the device separating layer toward a side distant from the cell region rather than the device separating layer;

a first conductivity type semiconductor thin film layer whose resistance is higher than that of the first semiconductor layer on the first semiconductor layer between the plurality of second semiconductor layers and between one of the second semiconductor layers and the device separating layer;

a field plate disposed on the first semiconductor layer interposing an insulating film therebetween and formed to project to a side distant from the cell region rather than the plurality of second semiconductor layers, the field plate being electrically connected to one of the plurality of second semiconductor layers which is most distant from the cell region;

a first electrode which electrically contacts with both the unit cell and the device separating layer; and a second electrode which electrically contacts on a back face side of the low resistance layer.

19. A semiconductor device according to claim 18, wherein the semiconductor thin film layer whose resistance is higher than that of the first semiconductor layer is formed between the insulating film below the field plate and the first semiconductor layer.

20. A semiconductor device according to claim 18, wherein the unit cell is formed by forming a second conductivity type second semiconductor region on the first semiconductor layer and by forming a first conductivity type first semiconductor region formed in the second semiconductor region, and the plurality of second semiconductor layers have an impurity concentration lower than that of the second semiconductor region.

21. A semiconductor device according to claim 20, wherein the device separating layer has a same resistance as that of the plurality of second semiconductor layers and is electrically connected to the second semiconductor region in the unit cell.

22. A semiconductor device according to claim 21, further comprising:

a second conductivity type drawing cell region formed on a surface layer portion of the first semiconductor layer between the device separating layer and the unit cell, wherein carriers generated in the first semiconductor layer are pulled out to the first electrode through the drawing cell region by electrically connecting the drawing cell region and the first electrode.

23. A semiconductor device according to claim 20, wherein resistances of the device separating layer and the second semiconductor layers are set to be three times larger than that of the second semiconductor region.

24. A semiconductor device according to claim 18, wherein a resistance of the second semiconductor layers is set so that a depletion layer extending to the second semiconductor layers terminates within the second semiconductor layers when a reverse bias voltage is applied between the first and second electrodes.

25. A semiconductor device according to claim 18, wherein the second semiconductor region is provided with a deep base layer which is formed to be deeper than the base layer.

26. A semiconductor device comprising:

a semiconductor substrate including a first conductivity type semiconductor layer;

a cell region having a second conductivity type second semiconductor region formed on the semiconductor layer and a first conductivity type first semiconductor region formed on the second semiconductor region;

a first conductivity type field relaxing region whose resistance is higher than that of the semiconductor layer, which is formed in contact with a surface of the semiconductor layer in a peripheral area of the cell region.

27. A semiconductor device according to claim 26, wherein said second semiconductor region is formed on the semiconductor layer in the peripheral area, and a trench is formed to reach the semiconductor layer from a surface of the second semiconductor region and the field relaxing region is formed on a side face of the trench.

28. A semiconductor device according to claim 26, wherein the field relaxing region is formed on the semiconductor layer in the peripheral area.

29. A semiconductor device comprising:

a first conductivity type semiconductor substrate;

a first conductivity type semiconductor layer whose resistance is higher than that of the semiconductor substrate and which is formed on the semiconductor substrate;

a source electrode formed on a main surface of the semiconductor layer;

a drain electrode formed on a back surface of the semiconductor substrate;

a unit cell having a gate electrode and formed in a predetermined region of the semiconductor layer for controlling current flowing between the source electrode and the drain electrode by a voltage applied to the gate electrode;

a second conductivity type device separating layer formed in a periphery of a cell region in which the unit cell is formed and extended, on a surface layer portion of the first semiconductor layer, to a side distant from the cell region, the device separating layer being electrically connected to the source electrode;

a first conductivity type semiconductor thin film formed on a terminating part of the device separating layer which is located on a side most distant from the cell region, a resistance of the semiconductor thin film being higher than that of the semiconductor layer; and an electrode layer formed, interposing an insulating film, at least on the semiconductor thin film located on the semiconductor layer, the electrode layer being electrically connected to either one of the source electrode and the gate electrode.

30. A semiconductor device according to claim 29, further comprising:

a first conductivity type semiconductor region formed on the device separating layer so that an end thereof terminates within the device separating layer, wherein the semiconductor region has a resistance lower than the semiconductor thin film, and the source electrode electrically contacts with the semiconductor region and the device separating layer via a through hole formed in the semiconductor region.

31. A semiconductor device according to claim 29, wherein the unit cell comprises;

a second conductivity type base region having a predetermined depth and formed in a predetermined region of a surface layer portion of the semiconductor layer;

a first conductivity type source region formed in a predetermined region of a surface layer portion of the base region, which has a depth shallower than that of the base region;

a first conductivity type surface channel layer made of silicon carbide and disposed to link the source region and the semiconductor layer in an upper portion of the base region; and a gate insulating film interposed between the gate electrode and the surface channel layer, and wherein the source electrode contacts with the base region and the source region, and the surface channel layer and the semiconductor thin film have a same impurity concentration.

32. A semiconductor device according to claim 31, wherein the semiconductor region has a same impurity concentration as the source region.

* * * * *